United States Patent
Piccardi et al.

(10) Patent No.: US 11,410,726 B2
(45) Date of Patent: Aug. 9, 2022

(54) INTEGRATED CIRCUIT DEVICES FOR DRIVING CONDUCTORS TO TARGET VOLTAGE LEVELS

(71) Applicant: MICRON TECHNOLOGY, INC., Boise, ID (US)

(72) Inventors: Michele Piccardi, Cupertino, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/147,653

(22) Filed: Jan. 13, 2021

(65) Prior Publication Data
US 2021/0134368 A1    May 6, 2021

Related U.S. Application Data

(63) Continuation of application No. 16/388,179, filed on Apr. 18, 2019, now Pat. No. 10,902,920.

(51) Int. Cl.
*G11C 16/08* (2006.01)
*G11C 16/04* (2006.01)

(52) U.S. Cl.
CPC .......... *G11C 16/08* (2013.01); *G11C 16/0483* (2013.01)

(58) Field of Classification Search
CPC . G11C 16/0483; G11C 16/08; G11C 11/5628; G11C 16/10; G11C 16/3459
See application file for complete search history.

(56) References Cited

U.S. PATENT DOCUMENTS

| 8,953,380 | B1* | 2/2015 | Yu | G11C 16/10 365/185.28 |
| 9,646,662 | B2 | 5/2017 | Tiburzi et al. | |
| 2014/0126270 | A1* | 5/2014 | Minemura | G11C 13/0002 365/148 |
| 2018/0277228 | A1* | 9/2018 | Takada | G11C 11/5671 |
| 2022/0076750 | A1* | 3/2022 | Park | G11C 16/0483 |

* cited by examiner

*Primary Examiner* — Tuan T Nguyen
(74) *Attorney, Agent, or Firm* — Dicke, Billig & Czaja, PLLC

(57) ABSTRACT

Integrated circuit devices might include a controller configured to cause the integrated circuit device to apply a first voltage level to a first conductor while applying a second voltage level to a second conductor, apply a third voltage level to the first conductor while applying a fourth voltage level to the second conductor, and apply a fifth voltage level to the first conductor while applying the second voltage level to the second conductor. The second voltage level might correspond to a target voltage level for the second conductor. A difference between the third voltage level and the first voltage level might have a polarity opposite the polarity of a difference between the fourth voltage level and the second voltage level, and the same polarity of a difference between the fifth voltage level and the first voltage level. The fifth voltage level might correspond to a target voltage level for the first conductor.

22 Claims, 17 Drawing Sheets

INTEGRATED CIRCUIT DEVICES FOR DRIVING CONDUCTORS TO TARGET VOLTAGE LEVELS

RELATED APPLICATION

This Application is a Continuation of U.S. application Ser. No. 16/388,179, titled "DRIVING CONDUCTORS TO TARGET VOLTAGE LEVELS," filed Apr. 18, 2019, issued as U.S. Pat. No. 10,902,920 on Jan. 26, 2021, which is commonly assigned and incorporated herein by reference.

TECHNICAL FIELD

The present disclosure relates generally to integrated circuit operation, and, in particular, in one or more embodiments, the present disclosure relates to driving conductors to target voltage levels.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Integrated circuit devices generally contain multiple conductors, often in close proximity. The dimensions of the conductors are typically small, and certain dimensions might be on the order 25 nm or less. And a conductor might also be located on the order of 25 nm or less from two or more adjacent conductors. These characteristics can lead to significant resistance and capacitive coupling concerns, which can detrimentally impact the ability to drive a conductor to a target voltage level.

DETAILED DESCRIPTION

Figure 1:
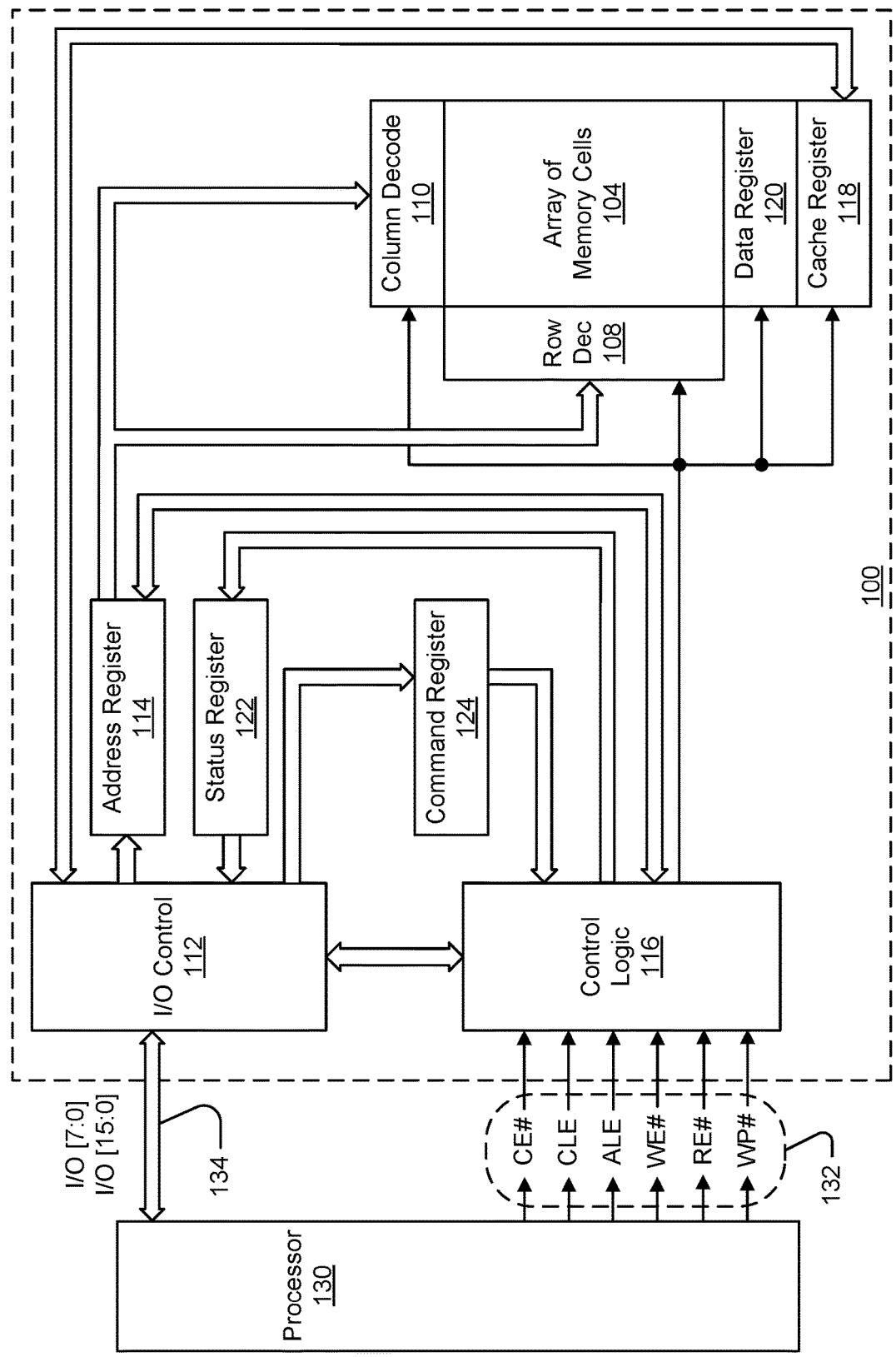
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

The timing of bringing a conductor to a target voltage level can be an important factor in the operating speed of an integrated circuit device. As noted, conductors of integrated circuit devices can have small dimensions and be placed in close proximity to adjacent conductors. These characteristics can detrimentally impact how quickly a conductor can be driven to a target (e.g., desired) voltage level. Various embodiments seek to facilitate an improvement in the timing of bringing a conductor to a target voltage level. Although various embodiments will be discussed with specific reference to word lines of a memory, the concepts can be applied to other types of adjacent conductors.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which may include read operations and verify operations], programming operations and/or erase operations) on the array of memory cells 104, and might be configured to perform methods in accordance with embodiments. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0]

of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
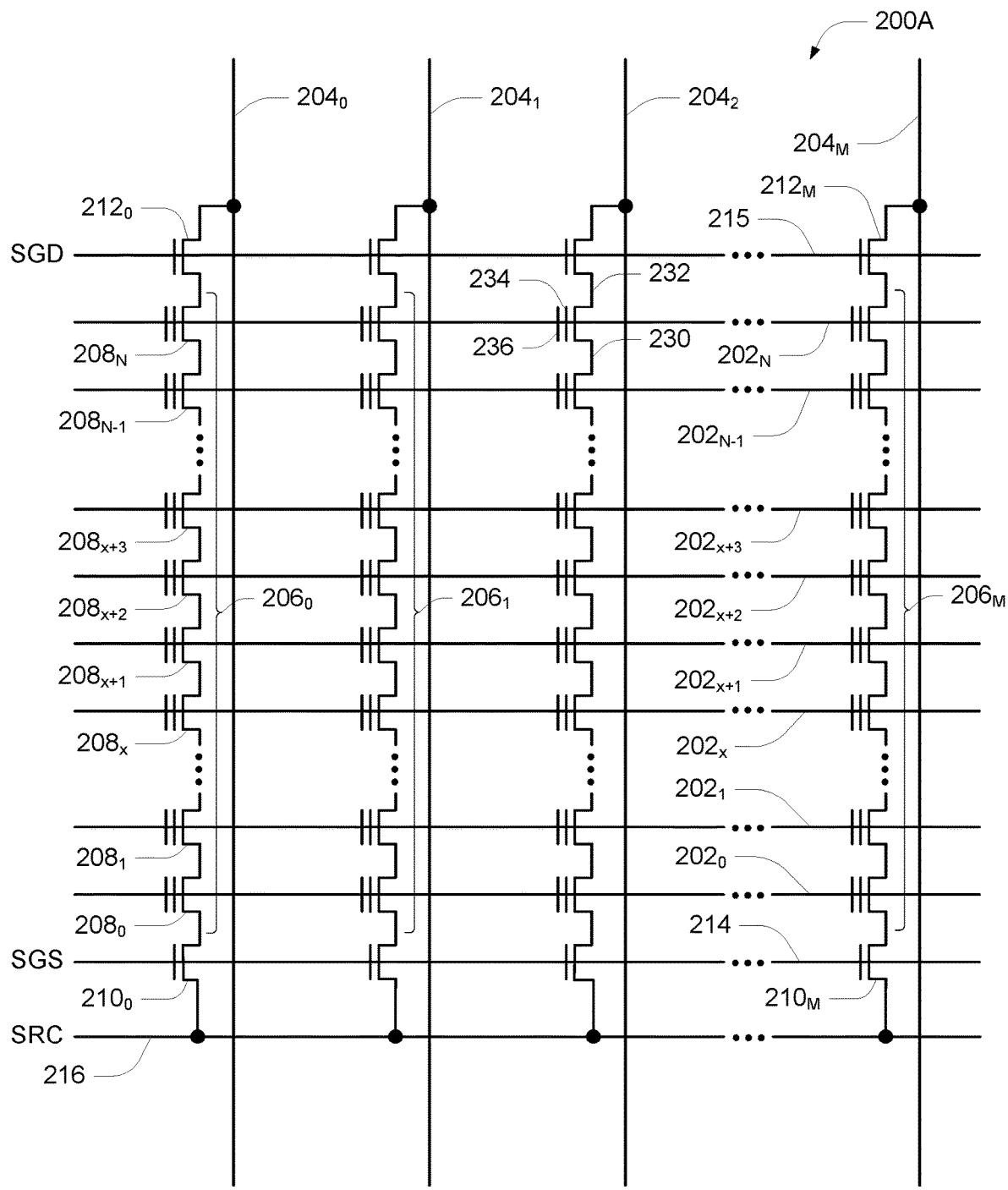
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, 2042, 2044, etc.) may be one physical page of memory cells 208 (e.g., even memory cells) while memory cells 208 commonly connected to word line $202_N$ and selectively connected to odd bit lines 204 (e.g., bit lines 2041, 2043, 2045, etc.) may be another physical page of memory cells 208 (e.g., odd memory cells). Although bit lines 2043-2045 are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
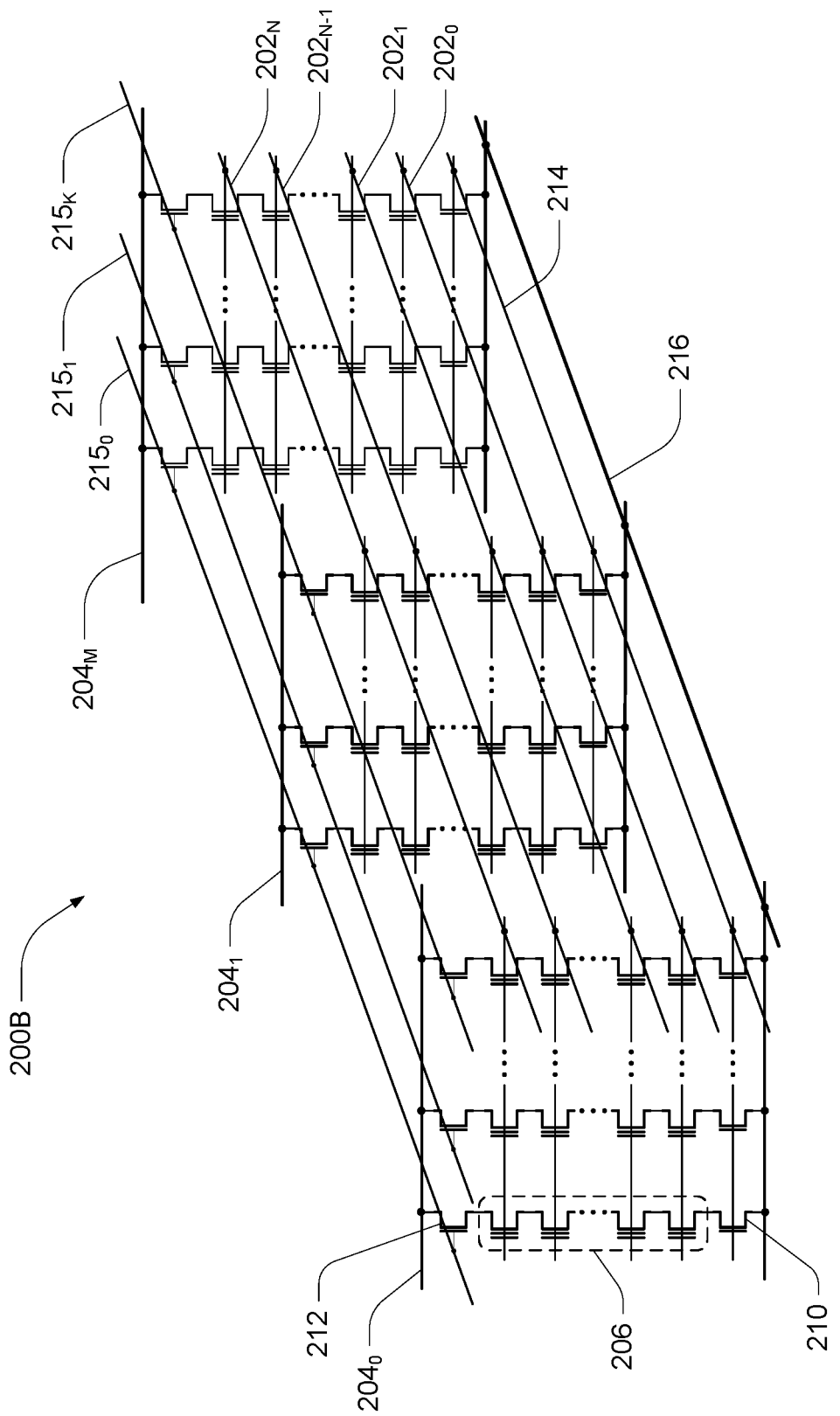

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines 2150-215K to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
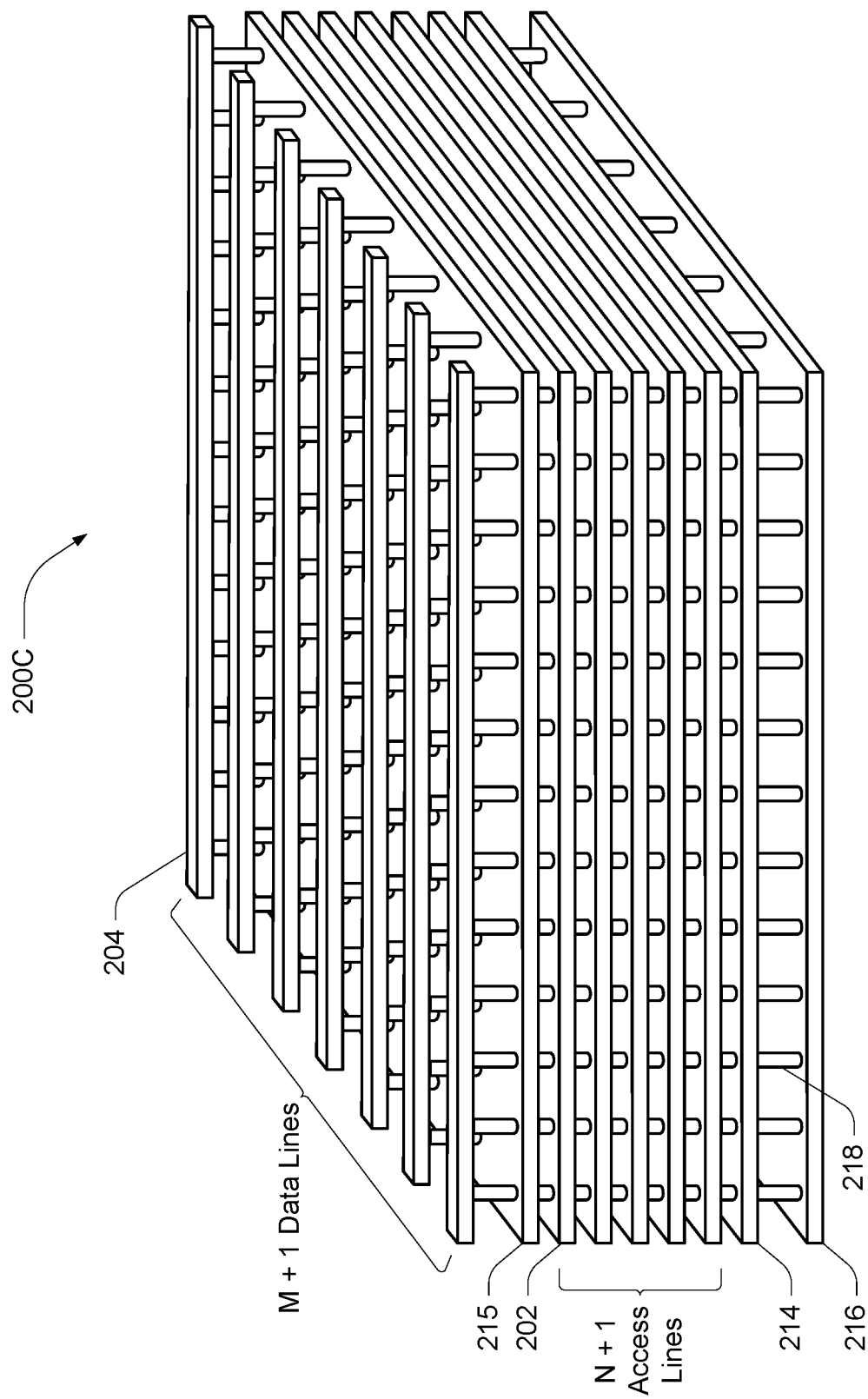
FIG. 2C is a perspective view of elements of a portion of an array of memory cells as could be used in a memory of the type described with reference to FIG. 1.

FIG. 2C is a perspective view of elements of a portion of an array of memory cells 200C as could be used in a memory of the type described with reference to FIG. 1. Like numbered elements in FIG. 2C correspond to the description as provided with respect to FIG. 2A. FIG. 2C provides alternative detail of one example of a three-dimensional NAND memory array structure. The three-dimensional NAND memory array 200C may incorporate vertical structures which may include semiconductor pillars 218 where a portion of a pillar 218 may act as a channel region of the memory cells of NAND strings. The pillars 218 may be each connected to a bit line 204 and to a source 216 in many-to-one relationships. A select transistor (e.g., drain select transistor) 212 (not shown in FIG. 2C) might be formed at each intersection of a pillar 218 and a select line (e.g., drain select line) 215. A select transistor (e.g., source select transistor) 210 (not shown in FIG. 2C) might be formed at each intersection of a pillar 218 and a select line (e.g., source select line) 214. A memory cell 208 (not shown in FIG. 2C) might be formed at each intersection of a pillar and an access line (e.g., word line) 202. The three-dimensional NAND memory array 200C depicts that the word lines 202 might be formed as conductive plates (e.g., parallel conductive plates), and each word line 202 might be adjacent (e.g., immediately adjacent) at least one other word line 202.

Figure 3A:
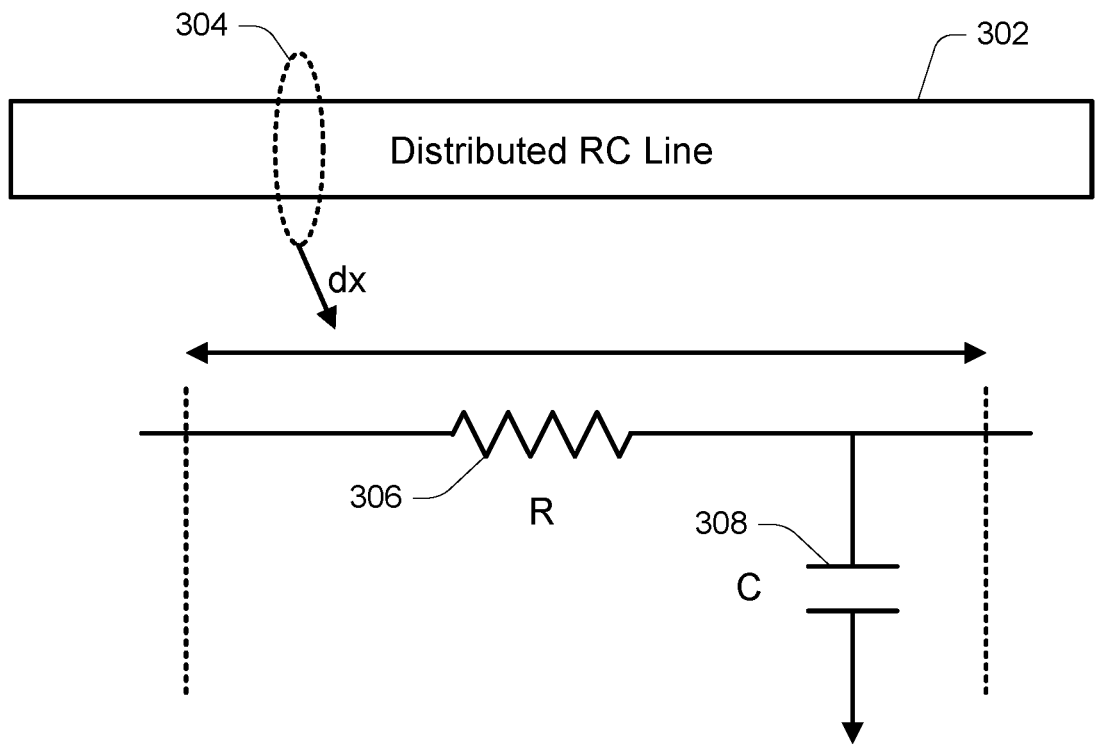
FIG. 3A is a conceptual depiction of a conductor demonstrating its resistive and capacitive characteristics for use with embodiments.

FIG. 3A is a conceptual depiction of a conductor 302 demonstrating its resistive and capacitive characteristics for use with embodiments. The conductor 302 might be a distributed RC (resistance-capacitance) circuit, and might correspond to an word line 202. Each portion 304 of the conductor 302 might have a corresponding resistance 306, which might result from its material(s) of construction and its dimensions, and a corresponding capacitance 308, which might result from its separation from neighboring conductors. The corresponding resistance 306 and capacitance 308 of a portion 304 of the conductor 302 might be the same or different than corresponding resistances or capacitances of other portions of the conductor 302. That is, the conductor 302 might have uniform materials of construction and dimensions, and uniform relationships to neighboring conductors, or, as may be likely in industrial fabrication, the conductor 302 might vary in materials of construction, dimensions and/or relationships to neighboring conductors. Regardless, if a voltage level is applied to one end of the conductor 302, the RC characteristics of the conductor 302 generally result in delays before the other end of the conductor 302 would reach that voltage level.

Figure 3B:
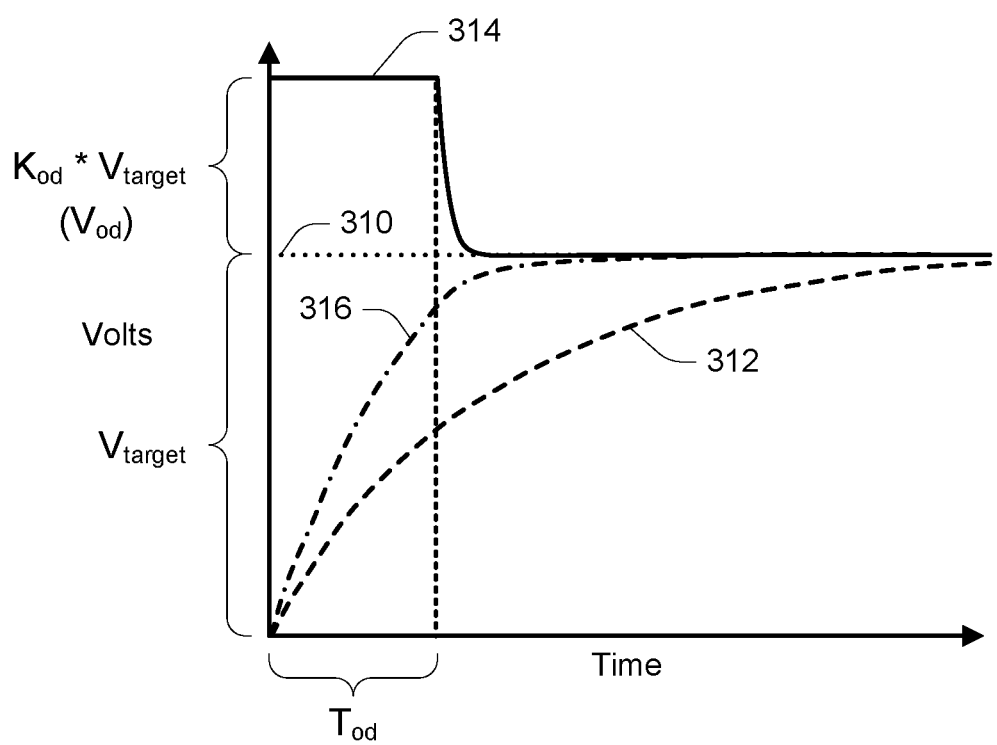
FIG. 3B is a graph of idealized waveforms depicting advantages of overdriving a conductor of the type depicted in FIG. 3A.

FIG. 3B is a graph of idealized waveforms depicting advantages of overdriving a conductor of the type depicted in FIG. 3A. The line 310 might represent a target voltage level ($V_{target}$) of a conductor 302. If the target voltage level $V_{target}$ were to be applied to the near end of the conductor 302, line 312 might represent the voltage level of the far end of the conductor 302 over time. To reduce the length of time necessary to reach the target voltage level $V_{target}$ at the far end of the conductor 302, the voltage level applied to the near end of the conductor 302 might be overdriven for some period of time. For example, the voltage level applied to the near end of the conductor 302 might be increased by some fraction $K_{od}$ of $V_{target}$ (e.g., $K_{od}*V_{target}$) for some period of time $T_{od}$. The product $K_{od}*V_{target}$ might be referred to as an overdrive voltage difference $V_{od}$, and the period of time $T_{od}$ might be referred to as an overdrive time $T_{od}$.

If the overdrive voltage difference $V_{od}$ is applied to the near end of the conductor 302 for the overdrive time $T_{od}$, and then reduced to the target voltage level $V_{target}$, line 316 might represent the voltage level of the far end of the conductor 302 over time. It can be seen that this use of the overdrive voltage difference $V_{od}$ for the overdrive time $T_{od}$ can be used to reduce the length of time necessary to bring the far end of the conductor 302 to its target voltage level $V_{target}$. It will be apparent that if the overdrive voltage difference $V_{od}$ were to be applied for too long, the conductor 302 would exceed its target voltage level $V_{target}$.

Figure 3C:
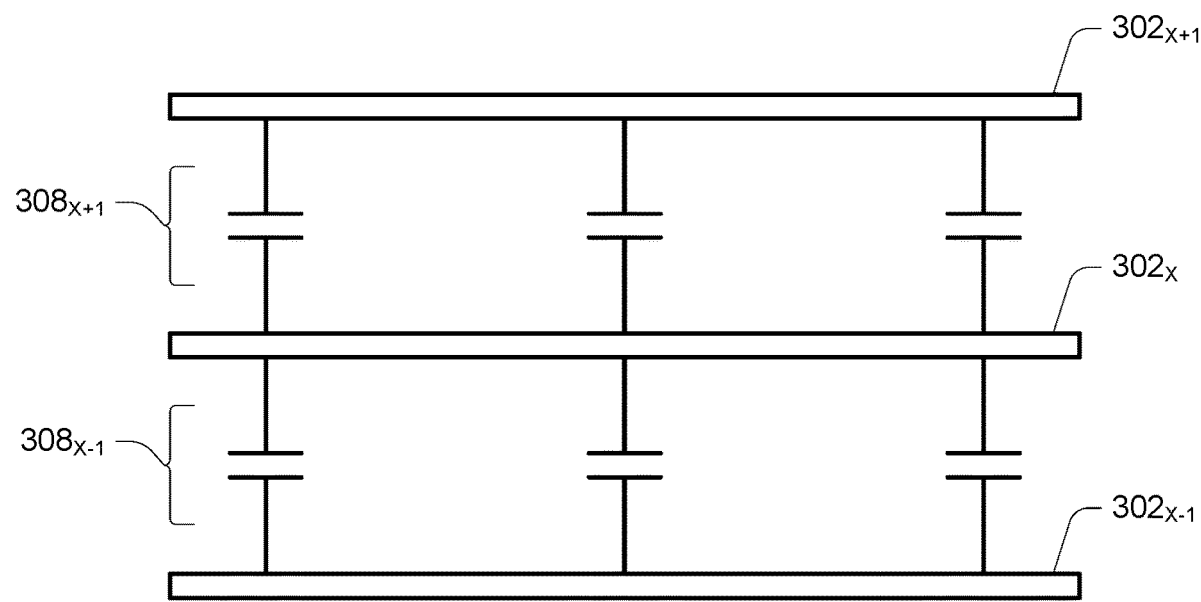
FIG. 3C is a conceptual depiction of adjacent conductors of the type depicted in FIG. 3A.

FIG. 3C is a conceptual depiction of adjacent conductors 302 of the type depicted in FIG. 3A. FIG. 3C depicts that a conductor $302_x$ might be adjacent (e.g., immediately adjacent) a conductor $302_{x+1}$ and a conductor $302_{x-1}$. The conductor $302_x$ might be parallel to the conductor $302_{x+1}$ and to the conductor $302_{x-1}$. The conductor $302_x$ might have a capacitive component $308_{x+1}$ between it and the conductor $302_{x+1}$. The conductor $302_x$ might further have a capacitive component $308_{x-1}$ between it and the conductor $302_{x-1}$. Although not depicted in FIG. 3C, the conductor 302, might have capacitive components, although generally to a lesser extent, between further adjacent conductors. For example, if the conductor $302_x$ corresponded to an word line $202_x$ of FIG. 2A, the word line $202_x$ might have a first capacitive component having a value $C_1$ with its immediately adjacent word line $202_{x+1}$, a second capacitive component having a value $C_2$ with its secondary adjacent word line $202_{x+2}$, a third capacitive component having a value $C_3$ with its tertiary adjacent word line $202_{x+3}$, and so on, where $C_1>C_2>C_3> \ldots$. The word line $202_x$ might have corresponding capacitive components on its other side, e.g., other word lines 202 on the source 216 side. These capacitive components can interfere with the settling time of the voltage level of the conductor $302_x$.

Figure 4A:
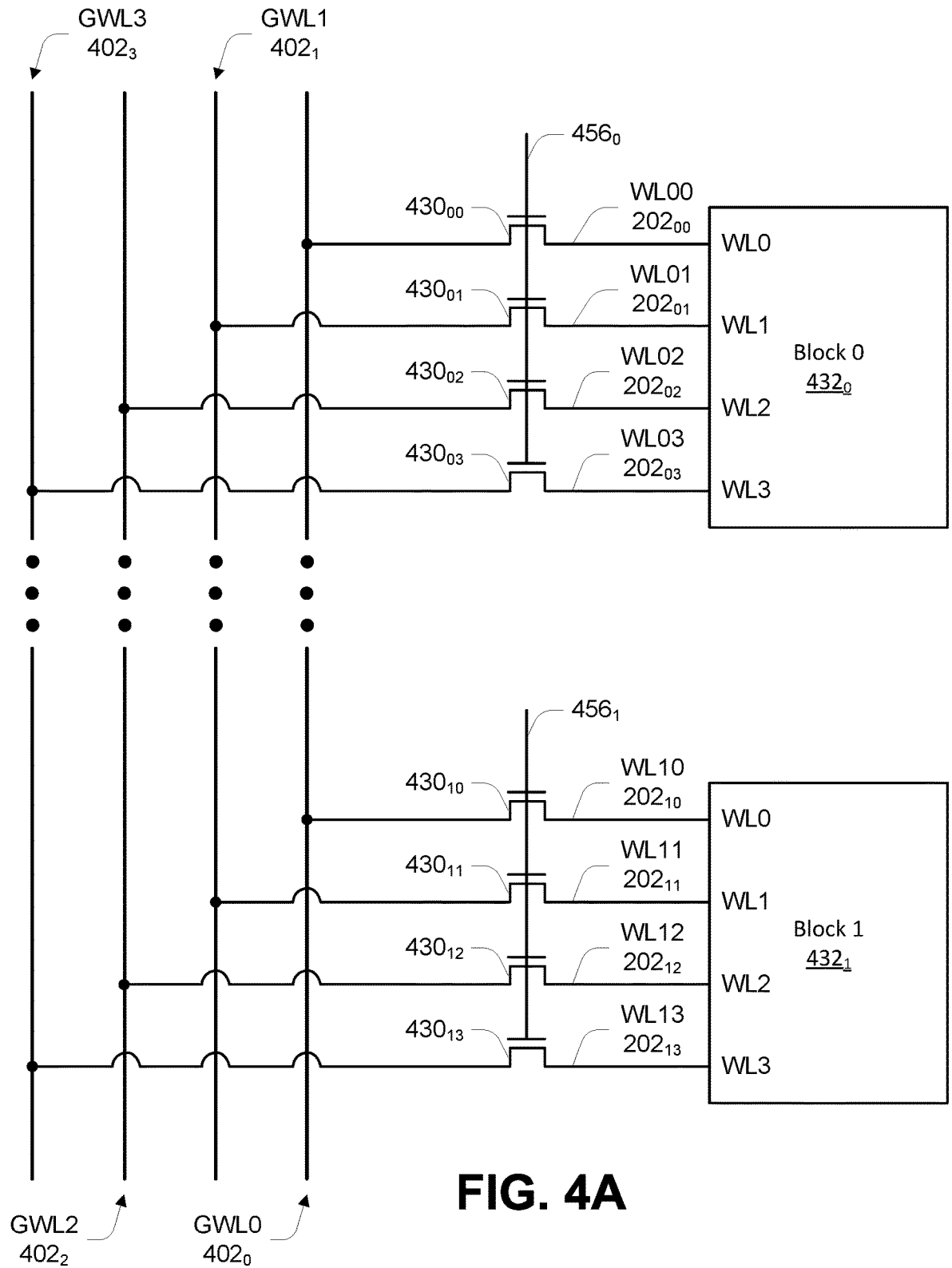
FIG. 4A is a schematic of a portion of an array of memory cells as could be used in a memory device of the type described with reference to FIG. 1.

Applying voltage levels to conductors might utilize a voltage driver. In the case of memory devices, voltage levels applied to an access line might be distributed to various portions of an array of memory cells further using global access lines. FIG. 4A is a schematic of a portion of an array of memory cells as could be used in a memory device of the type described with reference to FIG. 1 and depicting the many-to-one relationship between local access lines (e.g., word lines 202) and global access lines (e.g., global word lines 402).

As depicted in FIG. 4A, a plurality of memory blocks 432 may have their local access lines (e.g., word lines 202) commonly selectively connected to a plurality of global access lines (e.g., global word lines 402). A memory block 432 may include a plurality of memory strings 206 commonly coupled to a particular set of word lines 202. For example, the memory strings $206_0$-$206_M$ of FIG. 2A, or some portion thereof, may represent a memory block 432. Although FIG. 4A depicts only memory blocks $432_0$ and $432_1$ (Block 0 and Block 1), additional memory blocks 432 may have their word lines 202 commonly connected to global word lines 402 in a like manner. Similarly, although FIG. 4A depicts only four word lines 202, memory blocks 432 may include fewer or more word lines 202.

To facilitate memory access operations to specific memory blocks 432 commonly coupled to a given set of global word lines 402, each memory block 432 may have a corresponding set of block select transistors 430 in a one-to-one relationship with their word lines 202. Control gates of the set of block select transistors 430 for a given memory block 432 may have their control gates commonly connected to a corresponding block select line 456. For example, for memory block $432_0$, word line $202_{00}$ may be selectively connected to global word line $402_0$ through block select transistor $430_{00}$, word line $202_{01}$ may be selectively connected to global word line $402_1$ through block select transistor $430_{01}$, word line $202_{02}$ may be selectively connected to global word line $402_2$ through block select transistor $430_{02}$, and word line $202_{03}$ may be selectively connected to global word line $402_3$ through block select transistor $430_{03}$, while block select transistors $430_{00}$-$430_{03}$ are responsive to a control signal received on block select line $456_0$.

Figure 4B:
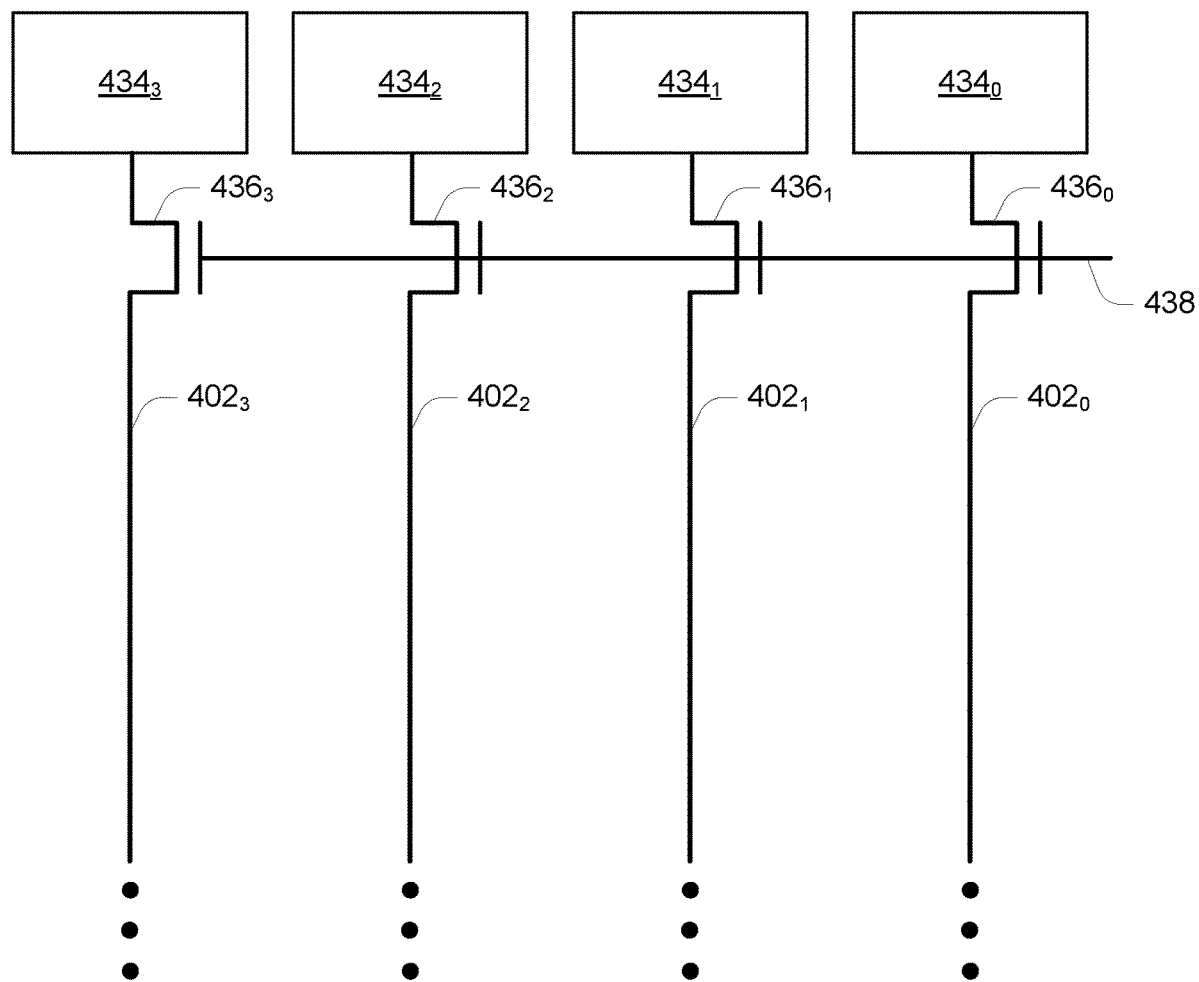
FIG. 4B is a schematic of a driver configuration for global access lines as could be used with the portion of the array of memory cells of FIG. 4A.

Global access lines are typically connected to driver circuitry (e.g., voltage drivers) to apply the various voltage levels to the global access lines for the various access operations. FIG. 4B is a schematic of a driver configuration for global access lines as could be used with the portion of the array of memory cells of FIG. 4A. FIG. 4B shows that global access lines (e.g., global word lines $402_0$-$402_3$) may be selectively connected to global access line drivers (e.g., global word line drivers $434_0$-$434_3$) through driver select transistors $436_0$-$436_3$, respectively. Although driver select transistors $436_0$-$436_3$ are shown to be commonly connected to a single driver select line 438, such that all global word lines $402_0$-$402_3$ are either commonly connected to, or commonly isolated from, their respective global word line driver $434_0$-$434_3$, each driver select transistor 436 could receive its own control signal to allow individual connection or isolation.

Figure 5A:
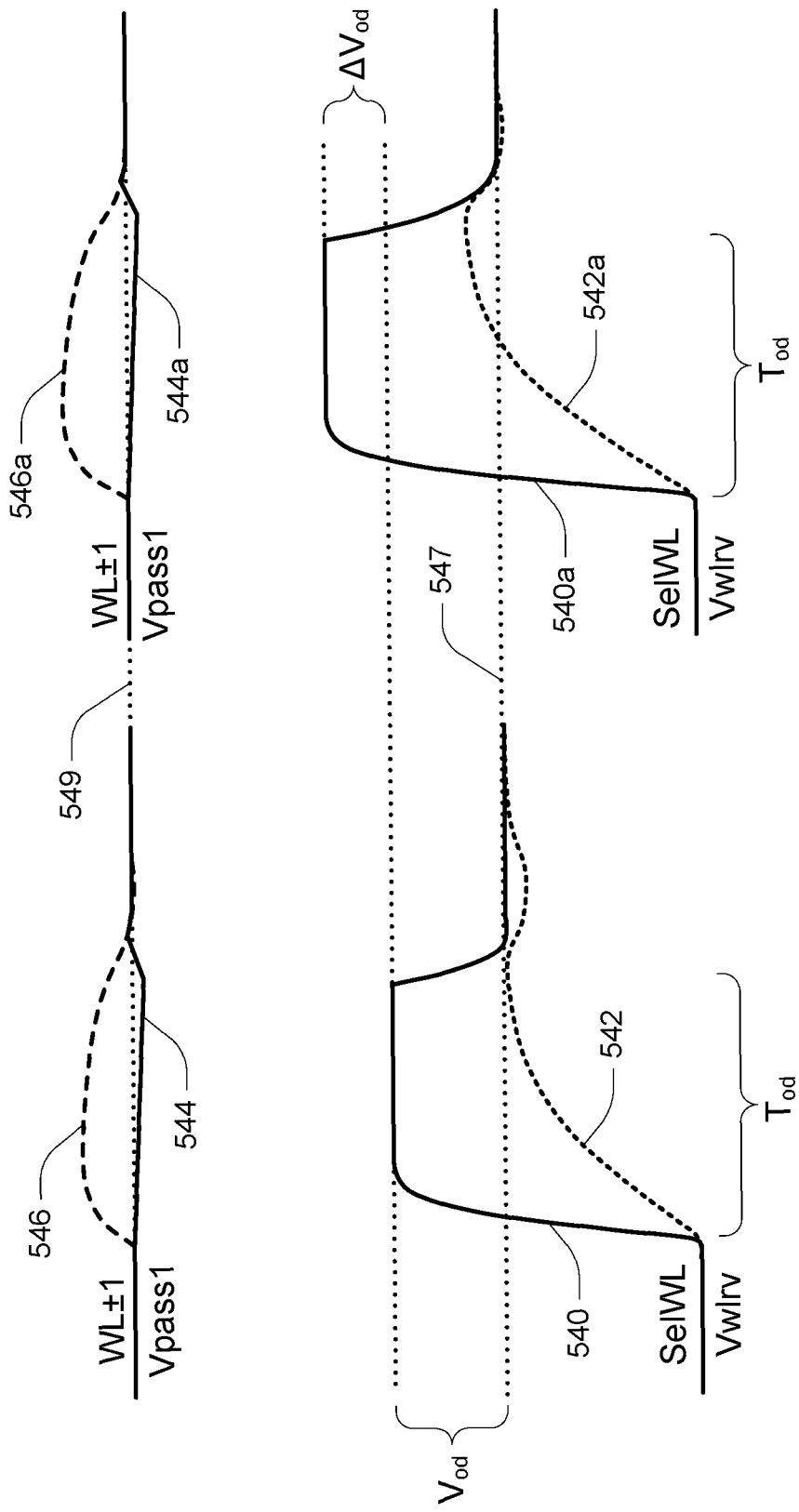
FIGS. 5A-5B depict waveforms of adjacent conductors and their drivers using various overdrive conditions of the related art.
Figure 5B:
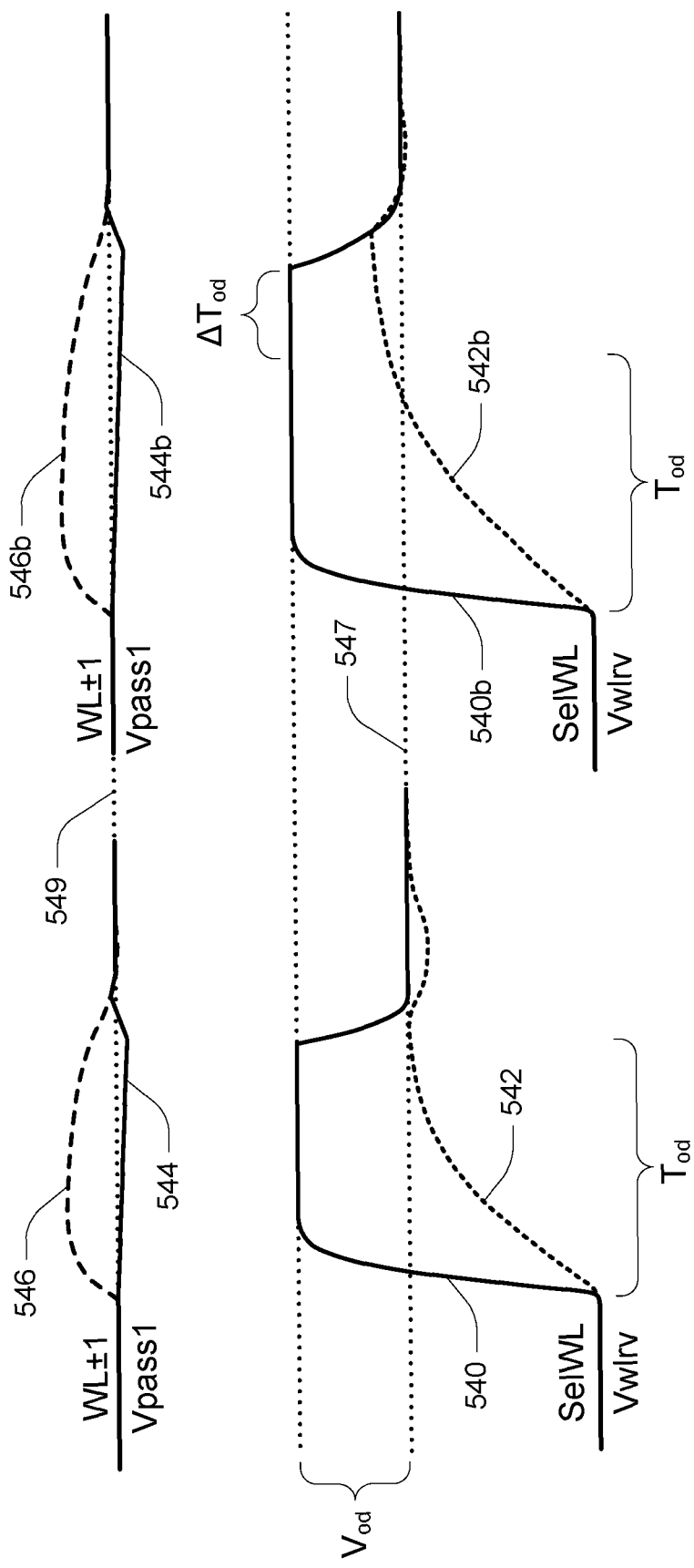

FIGS. 5A-5B depict waveforms of adjacent conductors and their drivers using various overdrive conditions of the related art. The examples of FIGS. 5A and 5B each depict a situation of applying the overdrive voltage difference $V_{od}$ for the overdrive time $T_{od}$ in the left side of the Figures. The right side of FIG. 5A depicts a variation where the overdrive voltage difference $V_{od}$ is increased by $\Delta V_{od}$, while the right side of FIG. 5B depicts a variation where the overdrive time $T_{od}$ is increased by $\Delta T_{od}$. In FIGS. 5A and 5B, line 540 might represent the voltage level (e.g., a read voltage Vwlrv) applied by a voltage driver connected to a first end (e.g., near end) of a word line (SelWL) selected for a sensing operation (e.g., a read operation or a verify operation) using the overdrive voltage difference $V_{od}$ for the overdrive time $T_{od}$. Line 542 might represent a voltage level of a second end (e.g., far end) of the selected word line SelWL. Line 544 might represent the voltage level (e.g., a pass voltage Vpass1) applied to a first end (e.g., near end) of word lines (WL±1) unselected for the sensing operation and adjacent (e.g., immediately adjacent) the selected word line SelWL. Line 546 might represent a voltage level of a second end (e.g., far end) of the unselected word lines WL±1. Line 547 might represent a target voltage level $V_{target}$ of the selected word line SelWL, and line 549 might represent a target voltage level of the pass voltage Vpass1.

Although line 544 does exhibit a voltage level fluctuation, this is due to the effects, e.g., capacitive coupling effects, on the unselected word lines WL±1 being driven, and does not represent an intention to change the voltage level applied to the unselected word lines WL±1. Therefore, as used herein, applying a particular voltage level to a conductor means that the intended voltage level of the applied voltage has the particular voltage level. For example, it is common to utilize charge pumps (not shown in the Figures) to generate voltages utilized in the operation of integrated circuit devices, and charge pumps might be used to supply voltage levels to driver circuitry. Charge pumps often utilize feedback control to maintain their output voltage level at some target voltage level. If the load of the charge pump, e.g., a conductor receiving the output voltage level, experiences a change in voltage level, the output voltage level of the charge pump might tend to follow that change in voltage level until the feedback control is able to respond in a manner to return the output voltage level to its target voltage level. Therefore, as used herein, such fluctuations do not represent a change in the applied voltage level.

In FIG. 5A, line 540a might represent the voltage level (e.g., a read voltage Vwlrv) applied by a voltage driver connected to a first end (e.g., near end) of a word line (SelWL) selected for a sensing operation using the overdrive voltage difference $V_{od}$+$\Delta V_{od}$ for the overdrive time $T_{od}$. Line 542a might represent a voltage level of a second end (e.g., far end) of the selected word line SelWL. Line 544a might represent the voltage level (e.g., a pass voltage Vpass1) applied to a first end (e.g., near end) of word lines (WL±1) unselected for the sensing operation and adjacent (e.g., immediately adjacent) the selected word line SelWL. Line 546a might represent a voltage level of a second end (e.g., far end) of the unselected word lines WL±1.

In FIG. 5B, line 540b might represent the voltage level (e.g., a read voltage Vwlrv) applied by a voltage driver connected to a first end (e.g., near end) of a word line (SelWL) selected for a sensing operation using the overdrive voltage difference $V_{od}$ for the overdrive time $T_{od}+\Delta T_{od}$. Line 542b might represent a voltage level of a second end (e.g., far end) of the selected word line SelWL. Line 544b might represent the voltage level (e.g., a pass voltage Vpass1) applied to a first end (e.g., near end) of word lines (WL±1) unselected for the sensing operation and adjacent (e.g., immediately adjacent) the selected word line SelWL. Line 546b might represent a voltage level of a second end (e.g., far end) of the unselected word lines WL±1.

The example using the overdrive voltage difference $V_{od}$ for the overdrive time $T_{od}$ in FIGS. 5A and 5B demonstrates that due to capacitive coupling between the selected word line SelWL and the unselected word lines WL±1, overdriving the selected word line SelWL can result in an increase in the voltage level of line 546 during the overdrive time $T_{od}$. It is recognized that while it may be intended to apply the pass voltage Vpass1 to the unselected word lines WL±1 during the duration of the overdrive time $T_{od}$, the coupling effects may interfere with the voltage driver's ability to maintain that voltage level. Upon reducing the voltage level of the line 540, the capacitive coupling between the selected word line SelWL and the unselected word lines WL±1 can result in a decrease in the voltage level of the line 542 before it returns to its target voltage level 547, thus increasing settling time of the selected word line SelWL. It is known to use increases in overdrive voltage and/or overdrive time to mitigate such effects.

The example on the right side of FIG. 5A, using the overdrive voltage difference $V_{od}+\Delta V_{od}$ for the overdrive time $T_{od}$, exhibits similar capacitive coupling effects between the selected word line SelWL and the unselected word lines WL±1. However, the voltage level of the line 542a can be forced over its target voltage level $V_{target}$ by using the overdrive voltage difference $V_{od}+\Delta V_{od}$ for the overdrive time $T_{od}$. In this manner, upon reducing the voltage level of the line 540a, the capacitive coupling between the selected word line SelWL and the unselected word lines WL±1 may result in a decrease in the voltage level of the line 542a, but it might return to its target voltage level 547 more quickly than the scenario on the left side of FIG. 5A.

The example on the right side of FIG. 5B, using the overdrive voltage difference $V_{od}$ for the overdrive time $T_{od}+\Delta T_{od}$, again exhibits similar capacitive coupling effects between the selected word line SelWL and the unselected word lines WL±1. However, the voltage level of the line 542b can be forced over its target voltage level $V_{target}$ by using the overdrive voltage difference $V_{od}$ for the overdrive time $T_{od}+\Delta T_{od}$. In this manner, upon reducing the voltage level of the line 540b, the capacitive coupling between the selected word line SelWL and the unselected word lines WL±1 may result in a decrease in the voltage level of the line 542b, but it might return to its target voltage level 547 more quickly than the scenario on the left side of FIG. 5B.

While increasing the overdrive voltage difference and/or increasing the overdrive time might be used to increase the settling time of a conductor, the resulting overshoot of the voltage level of the conductor beyond its target voltage level may have detrimental impact on the operation of an integrated circuit device. For example, in a memory device, sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. Increasing a voltage level of a word line selected for a sensing operation might result in activation of memory cells that would not be activated if the target voltage level were applied. This could result in unintended current flow, which might require additional settling time of the data lines before a valid sensing could be performed.

Figure 6:
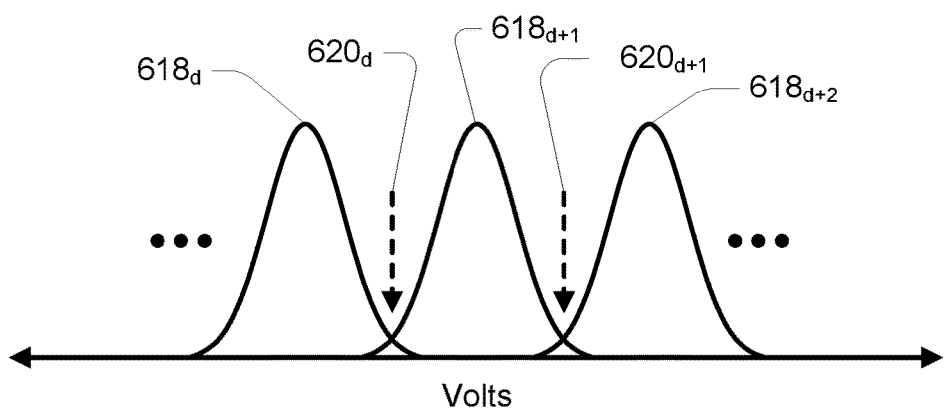
FIG. 6 is a conceptual depiction of threshold voltage distributions of a plurality of memory cells following a programming operation for use with embodiments.

FIG. 6 is a conceptual depiction of threshold voltage distributions of a plurality of memory cells following a programming operation for use with embodiments. The threshold voltage distributions $618_d$-$618_{d+2}$ of FIG. 6 might represent some portion of the distributions used to represent respective data states. Typically, at the completion of a programming operation, the threshold voltage distributions $618_d$-$618_{d+2}$ would be separated by some margin or dead space. However, it is not uncommon for these threshold voltage distributions $618_d$-$618_{d+2}$ to widen over time, such that overlap, as depicted in FIG. 6, may occur.

During a sensing operation in NAND memory, various increasing voltage levels might be applied to the control gates of the memory cells selected for the sensing operation, while remaining memory cells in the strings of series-connected memory cells might receive a pass voltage (e.g., intended to activate these memory cells regardless of their data states). For example, a read voltage $620_d$ might be applied to the control gates of the memory cells of the threshold voltage distributions $618_d$-$618_{d+2}$, and memory cells first activating in response to the read voltage $620_d$ might be deemed to have the data state corresponding to the threshold voltage distribution $618_d$. The read voltage $620_{d+1}$ might be subsequently applied to the control gates of the memory cells of the threshold voltage distributions $618_d$-$618_{d+2}$, and memory cells first activating in response to the read voltage $620_{d+1}$ might be deemed to have the data state corresponding to the threshold voltage distribution $618_{d+1}$. However, as noted with reference to FIGS. 5A and 5B, where the intended read voltage is, for example, the read voltage $620_d$, but the voltage level applied to the control gates of the memory cells rises above this target voltage level (e.g., shifts to the right in FIG. 6), memory cells (e.g., more memory cells) of the threshold voltage distribution $618_{d+1}$ might activate, leading to unintended current flow. Various embodiments seek to mitigate this overshoot due to overdriving the conductor while further seeking to mitigate the detrimental impact of the capacitive coupling of adjacent conductors increasing settling time.

Figure 7:
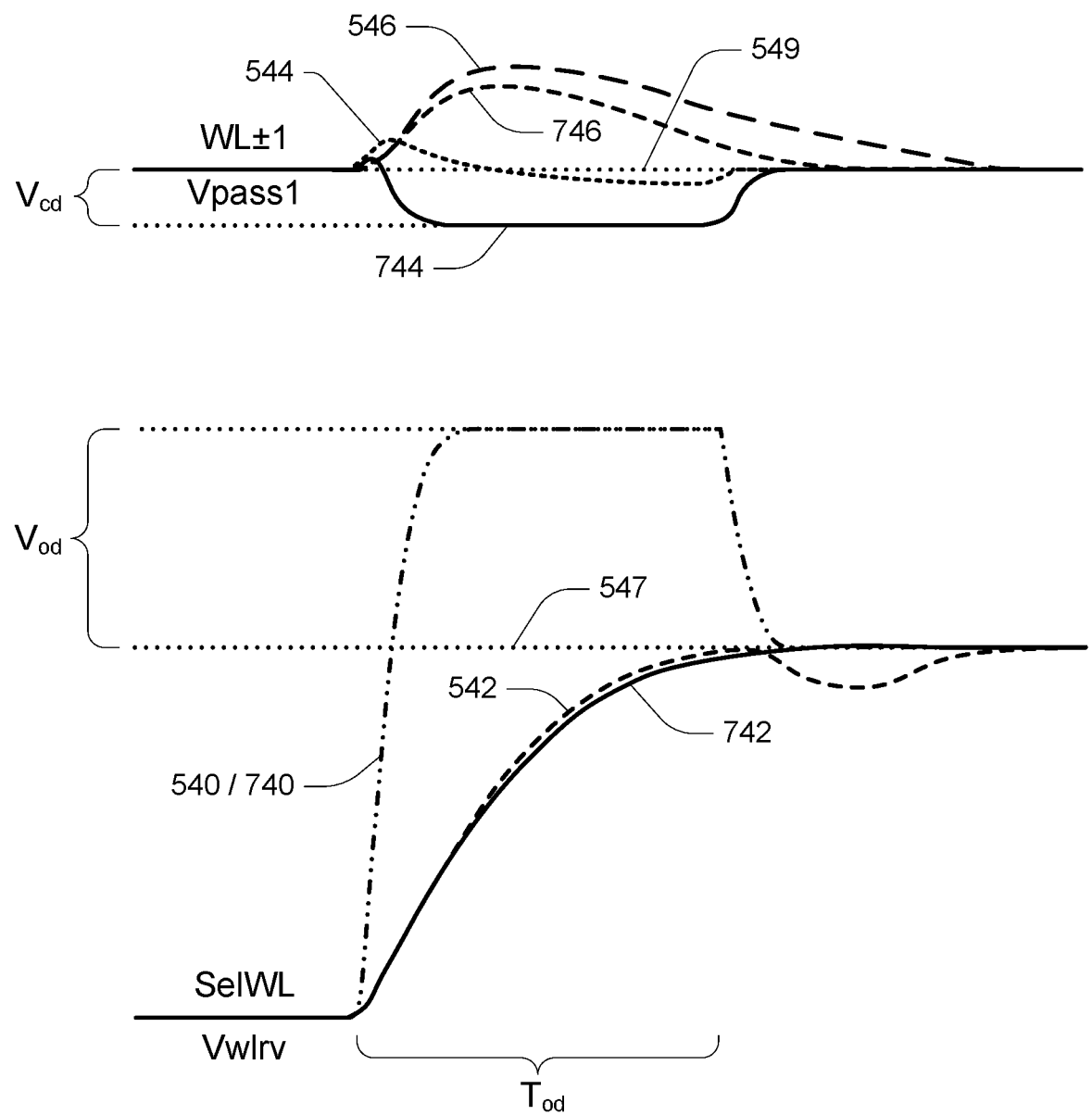
FIG. 7 depicts waveforms of adjacent conductors and their drivers using conditions in accordance with an embodiment compared to overdrive conditions of the related art.

FIG. 7 depicts waveforms of adjacent conductors and their drivers using conditions in accordance with an embodiment compared to overdrive conditions of the related art. The example of FIG. 7 depicts a situation of applying the overdrive voltage difference $V_{od}$ to the conductor for the overdrive time $T_{od}$. Values for the overdrive voltage difference $V_{od}$ and the overdrive time $T_{od}$ might be selected to bring the voltage level of the conductor to its target voltage level without going beyond its target voltage level by more than some predefined tolerance. Selection of such values is well understood and might, for example, be determined experimentally, empirically or through simulation. In contrast to the examples of FIGS. 5A and 5B, the adjacent conductors might be cross-driven during the overdrive time $T_{od}$. That is, where the overdrive voltage difference $V_{od}$ represents a positive voltage difference, the adjacent conductors might have a reduced voltage level applied during the overdrive time $T_{od}$.

In FIG. 7, lines 540, 542, 544, 546, 547 and 549 might correspond to the discussion of the left sides of FIGS. 5A and 5B, and may depict a sensing operation using the overdrive voltage difference $V_{od}$ for the overdrive time $T_{od}$ of the related art. Line 740 might represent the voltage level (e.g., a read voltage Vwlrv) applied by a voltage driver connected to a first end (e.g., near end) of a word line (SelWL) selected for a sensing operation using the overdrive voltage difference $V_{od}$ for the overdrive time $T_{od}$ in accordance with an embodiment. Line 742 might represent a voltage level of a second end (e.g., far end) of the selected word line SelWL in accordance with an embodiment. Line 744 might represent the voltage level (e.g., a pass voltage Vpass1) applied to a first end (e.g., near end) of word lines (WL±1) unselected for the sensing operation and adjacent (e.g., immediately adjacent) the selected word line SelWL in accordance with an embodiment. Line 746 might represent a voltage level of a second end (e.g., far end) of the unselected word lines WL±1 in accordance with an embodiment. Although not depicted in FIG. 7, word lines of higher levels of adjacency, e.g., WL±2, WL±3, and so on, might have the same target voltage level 549 as the word lines WL±1, or they might have a different target voltage level (or respective different target voltage levels), e.g., lower than or higher than the target voltage level 549. For example, in a sensing operation, various strategies to mitigate read disturb might see the word lines WL±1 having a higher target voltage level, or a lower target voltage level, than word lines of higher levels of adjacency.

By cross-driving the unselected word lines WL±1 with a reduced voltage level during the overdrive time $T_{od}$ as represented by line 744, the voltage level of the unselected word lines WL±1 as represented by line 746 might not rise as much as the example of the related art, where the unselected word lines WL±1 are driven at their target voltage level 549 during the overdrive time $T_{od}$ as represented by line 544. As a result, the voltage level of the selected word line SelWL represented by line 742 might not rise as quickly as the voltage level of the selected word line SelWL represented by line 542. However, the voltage level of the selected word line SelWL represented by line 742 also may not be pulled lower at the end of the overdrive time $T_{od}$ as much as the voltage level of the selected word line SelWL represented by line 542. As such, the use of cross-driving in accordance with embodiments might reduce the settling time of the selected word line SelWL.

The cross-drive voltage difference $V_{cd}$ might have a magnitude that is less than a magnitude of the overdrive voltage difference $V_{od}$. For example, the magnitude of the cross-drive voltage difference $V_{cd}$ might be equal to $|X*V_{od}|$ where $0<X<1$. As one example, a value of X=0.25 might facilitate a reduction in settling time, e.g., a time to reach and settle to within ±10 mV of its target voltage level, compared to the related art using a same value of $V_{od}$. Similarly, a value of X=0.25 might facilitate a reduction in the value of $V_{od}$ that would produce a similar (e.g., same or lower) settling time compared to the related art. Other values of X might be expected to facilitate improvements over the related art relying on overdrive alone. For some embodiments, $0.125<=X<=0.5$. Facilitating a reduction in the overdrive voltage difference $V_{od}$ without sacrificing settling time can provide industrial advantage, for example, as noted with respect to sensing operations in a memory.

The cross-drive voltage difference $V_{cd}$ might further have an opposite polarity than the overdrive voltage difference $V_{od}$. For example, where a difference between the voltage level applied to the selected word line SelWL during the overdrive time $T_{od}$ and its target voltage level 547 has a first magnitude and a first polarity, e.g., positive, the difference between the voltage level applied to the unselected word lines WL±1 during the overdrive time $T_{od}$ and its target voltage level 549 has a second magnitude, less than the first magnitude, and a second polarity, opposite the first polarity, e.g., negative.

Where the magnitude of the cross-drive voltage difference $V_{cd}$ for an immediately adjacent conductor is equal to $|X*V_{od}|$ where $0<X<1$, the magnitude of the cross-drive voltage difference $V_{cd}$ for a secondary adjacent conductor might be less than $|X*V_{od}|$. This concept might be extended, such that the magnitude of the cross-drive voltage difference $V_{cd}$ for a tertiary adjacent conductor might be less than the magnitude of the cross-drive voltage difference $V_{cd}$ for a secondary adjacent conductor, and so on. For example, the magnitude of the cross-drive voltage difference $V_{cd}$ for an Nth level adjacent conductor might be equal to $|X^N*V_{od}|$. Alternatively, the magnitude of the cross-drive voltage difference $V_{cd}$ for an Nth level adjacent conductor might be equal to $|X/N*V_{od}|$.

Similarly, the magnitude of the cross-drive voltage difference $V_{cd}$ for an Nth level adjacent conductor might be equal to the absolute value of the product of $V_{od}$ and some other function of X, where the magnitude of the cross-drive voltage difference $V_{cd}$ for a particular level of adjacency is less than, or equal to, the magnitude of the cross-drive voltage difference $V_{cd}$ for any lower level of adjacency. For example, the function of X might be $f(X, n)=\{Y_1, Y_2, \ldots, Y_N\}$, where $1>Y_1>Y_2>\ldots>Y_N>0$, for n=1 to N. It is recognized that higher levels of adjacency might be expected to exhibit diminishing returns in facilitating improvements described herein. Accordingly, for some levels of adjacency, the intended magnitude of the cross-drive voltage difference $V_{cd}$ might be equal to zero.

While the examples have depicted positive overdrive voltage differences $V_{od}$, the concepts discussed herein may be applied to negative overdrive voltage differences $V_{od}$. Thus, if a difference between the voltage level applied to the selected word line SelWL during the overdrive time $T_{od}$ and its target voltage level 547 had a first magnitude and a negative polarity, the difference between the voltage level applied to the unselected word lines WL±1 during the overdrive time $T_{od}$ and its target voltage level 549 might have a second magnitude, less than the first magnitude, and a positive polarity.

Figure 8A:
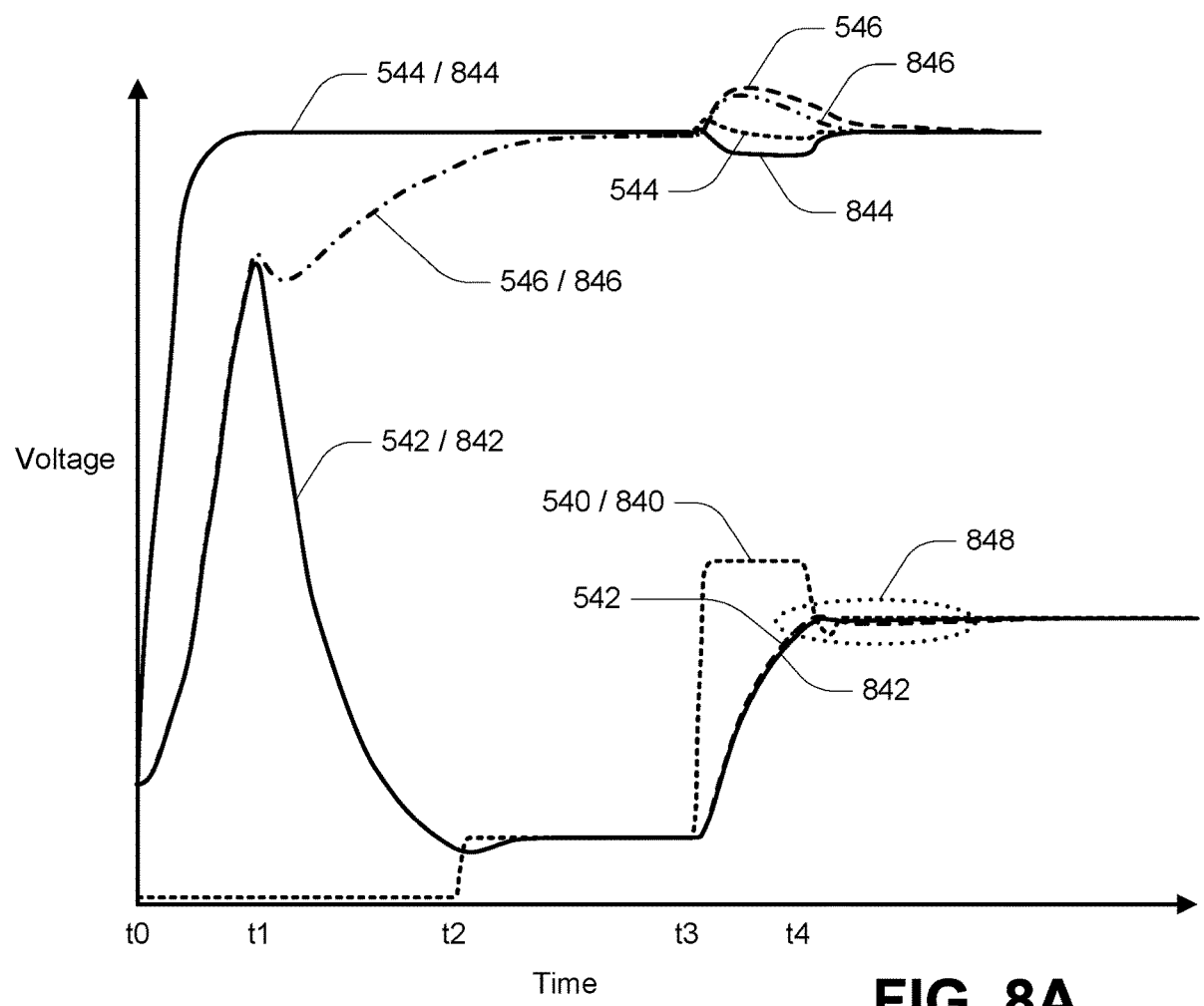
FIGS. 8A-8B depict waveforms of adjacent conductors and their drivers during a sensing operation using conditions in accordance with an embodiment compared to overdrive conditions of the related art.
Figure 8B:
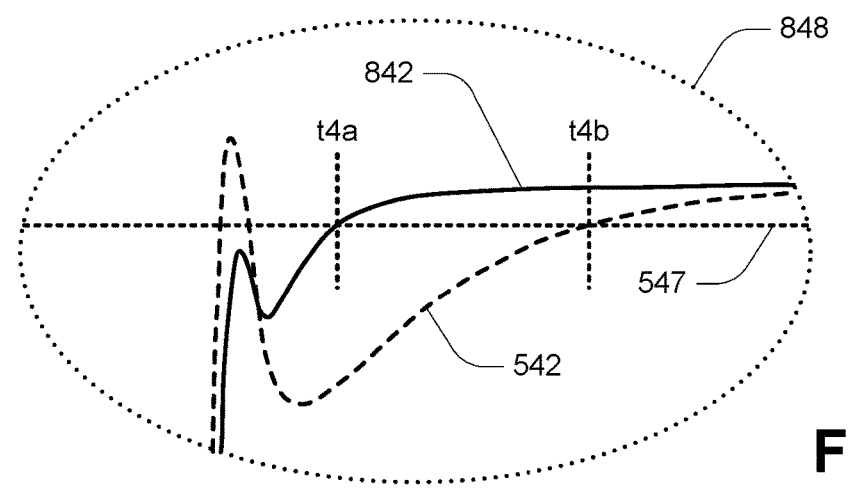

FIGS. 8A-8B depict waveforms of adjacent conductors and their drivers during a sensing operation using conditions in accordance with an embodiment compared to overdrive conditions of the related art. FIG. 8A provides additional detail of a more complete sensing operation as compared to FIG. 7, for example. FIG. 8B provides additional detail of differences as might be expected between driving word lines of the related art and driving word lines in accordance with an embodiment.

In FIG. 8, lines 540, 542, 544, 546, 547 and 549 might correspond to the discussion of the left sides of FIGS. 5A and 5B, and may depict a sensing operation using the overdrive voltage difference $V_{od}$ for the overdrive time $T_{od}$ of the related art. Line 840 might represent the voltage level (e.g., a read voltage Vwlrv) applied by a voltage driver connected to a first end (e.g., near end) of a word line (SelWL) selected for a sensing operation using the overdrive voltage difference $V_{od}$ for the overdrive time $T_{od}$ in accordance with an embodiment. Line 842 might represent a voltage level of a second end (e.g., far end) of the selected word line SelWL in accordance with an embodiment. Line 844 might represent the voltage level (e.g., a pass voltage Vpass1) applied to a first end (e.g., near end) of word lines (WL±1) unselected for the sensing operation and adjacent (e.g., immediately adjacent) the selected word line SelWL in accordance with an embodiment. Line 846 might represent a voltage level of a second end (e.g., far end) of the unselected word lines WL±1 in accordance with an embodiment.

During a sensing operation of a memory, it is common to apply the same voltage level of all word lines during a first portion of the sensing operation, then reducing the voltage level applied to the selected word line until the unselected word lines reach the target voltage level of the pass voltage. In FIG. 8A, all of the word lines (e.g., all word lines $202_0$-$202_N$ of a NAND string 206 of FIG. 2A) might be connected to receive the voltage level represented by line 544 for the related art and by line 844 in accordance with an embodiment at time t0. At time t1, the selected word line (e.g., word line $202_{x+1}$ of FIG. 2A) might be connected to receive the voltage level represented by line 540 for the related art and by line 840 in accordance with an embodiment. At time t2, the voltage level represented by line 540 for the related art and by line 840 in accordance with an embodiment might be raised to a first target voltage level for holding the selected word line while waiting for the unselected word lines to reach their target voltage level. At time t3, the voltage level represented by line 540 for the related art and by line 840 in accordance with an embodiment might be raised to a voltage level corresponding to the target voltage level $V_{target}$ of the selected word line plus the overdrive voltage difference $V_{od}$. Also at time t3, the voltage level represented by line 540 for the related art might be maintained at the target voltage for the unselected word lines, while the voltage level represented by line 840 in accordance with an embodiment might be lowered by the cross-drive voltage difference \Ted. At time t4, the voltage level represented by line 540 for the related art and by line 840 in accordance with an embodiment might be lowered to a voltage level corresponding to the target voltage level $V_{target}$ of the selected word line. Also at time t4, the voltage level represented by line 540 for the related art might be maintained at the target voltage for the unselected word lines, while the voltage level represented by line 840 in accordance with an embodiment might be raised to the target voltage for the unselected word lines.

Bubble 848 of FIG. 8A is depicted in more detail in FIG. 8B. In particular, FIG. 8B depicts a difference in response of the voltage level of the selected word line as might be expected between the use of a cross-drive voltage difference \Ted during the overdrive time $T_{od}$ in accordance with an embodiment, and maintaining the voltage level applied to the unselected word lines during the overdrive time $T_{od}$ of the related art. The line 842 in accordance with an embodiment might be considered to have settled, e.g., reaching and maintaining a particular voltage level within a particular tolerance, at time t4a. In contrast, the line 542 of the related art might not be considered to have settled until the time t4b. Furthermore, the overshoot of line 542 above the target voltage level 547 may cause unintended current flow during the sensing operation of the related art.

Figure 9:
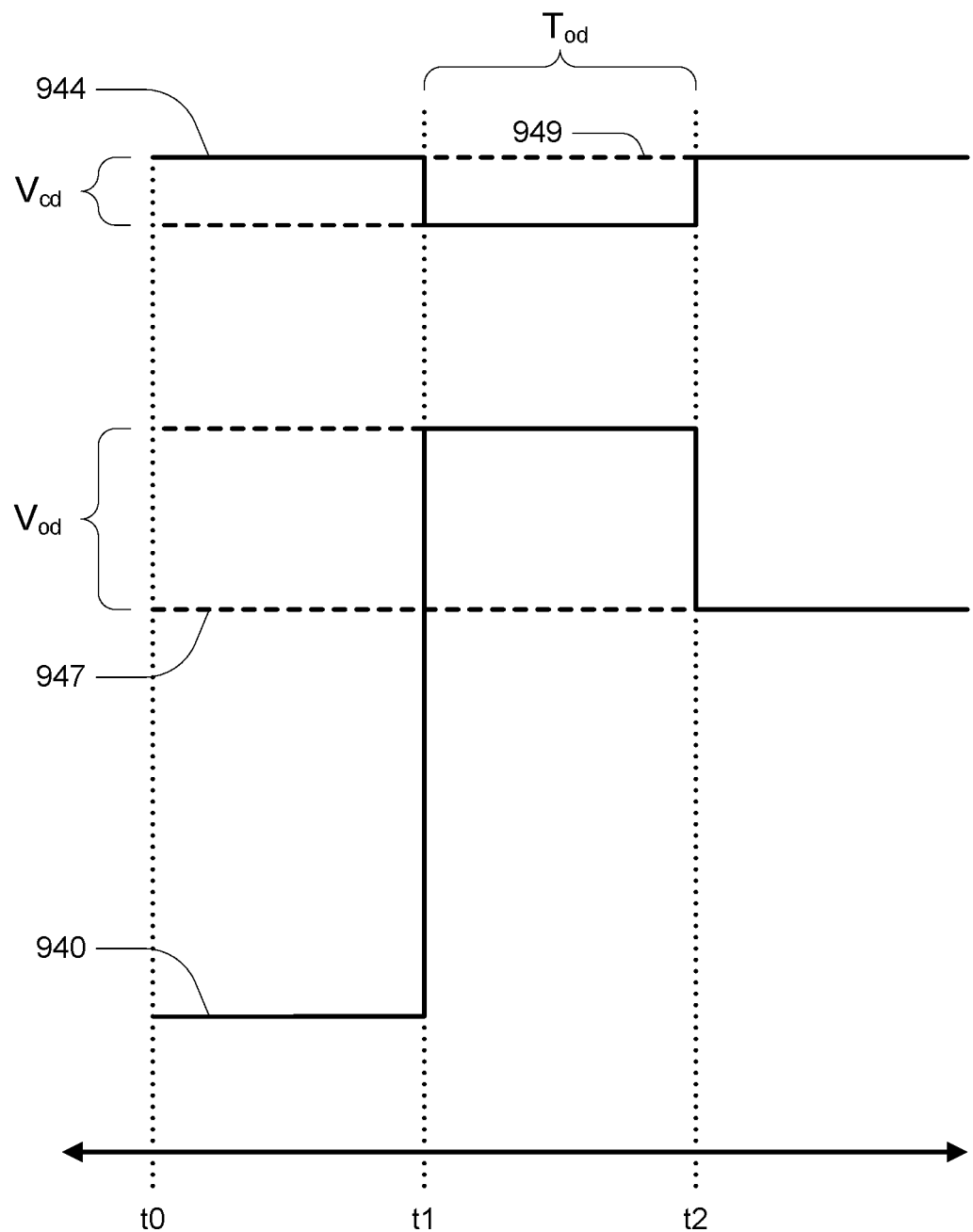
FIG. 9 conceptually depicts intended applied voltage levels for adjacent conductors using overdrive conditions in accordance with an embodiment.

FIG. 9 conceptually depicts intended applied voltage levels for adjacent conductors using overdrive conditions in accordance with an embodiment. In FIG. 9, line 940 might represent the voltage level (e.g., intended voltage level) to be applied to a first conductor at various times. Line 944 might represent the voltage level (e.g., intended voltage level) to be applied to a second conductor at various times. The second conductor might be adjacent, e.g., immediately adjacent, the first conductor. Alternatively, the second conductor might represent a secondary adjacent conductor, or other subsequent adjacent conductor.

At time t0, the line 940 might have a voltage level (e.g., initial voltage level) different than (e.g., lower than) a target voltage level 947 of the first conductor, while the line 944 might have a voltage level (e.g., initial voltage level) corresponding to a target voltage level 949 of the second conductor. At time t1, the line 940 might have a voltage level different than (e.g., higher than) the target voltage level 947 by a value equal to the overdrive voltage difference $V_{od}$, while the line 944 might have a voltage level different than (e.g., lower than) the target voltage level 949 by a value equal to the cross-drive voltage difference Vat. At time t2, the line 940 might have a voltage level equal to the target voltage level 947, while the line 944 might have a voltage level equal to the target voltage level 949.

Figure 10:
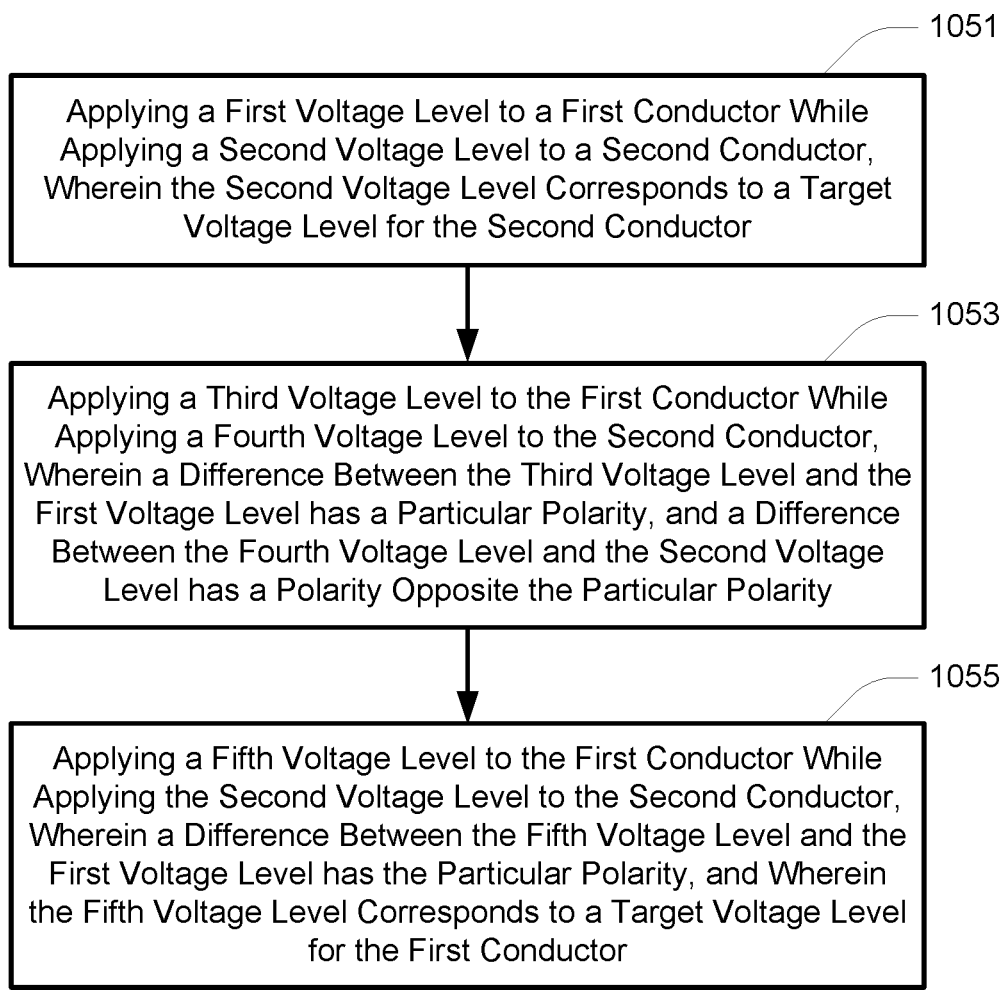
FIG. 10 is a flowchart of a method of driving conductors in accordance with an embodiment.

FIG. 10 is a flowchart of a method of driving conductors in accordance with an embodiment. At 1051, a first voltage level might be applied to a first conductor while applying a second voltage level to a second conductor. The second voltage level might correspond to a target voltage level for the second conductor. At 1053, e.g., subsequent to 1051, a third voltage level might be applied to the first conductor while applying a fourth voltage level to the second conductor. A difference between the third voltage level and the first voltage level might have a particular polarity, and a difference between the fourth voltage level and the second voltage level might have a polarity opposite the particular polarity. At 1055, e.g., subsequent to 1053, a fifth voltage level might be applied to the first conductor while applying the second voltage level to the second conductor. A difference between the fifth voltage level and the first voltage level might have the particular polarity. The fifth voltage level might correspond to a target voltage level for the first conductor. The difference between the third voltage level and the first voltage level might have a magnitude greater than the difference between the fifth voltage level and the first voltage level.

The first conductor might be adjacent (e.g., immediately adjacent) the second conductor. For example, the first conductor might correspond to a word line $202_x$, while the second conductor might correspond to an immediately adjacent word line $202_{x-1}$ or $202_{x+1}$. For some embodiments, the method of FIG. 10 might be performed for different levels of adjacency. For example, the first conductor might correspond to a word line $202_x$, while the second conductor might correspond to a secondary adjacent word line $202_{x-2}$ or $202_{x+2}$.

Furthermore, the method of FIG. 10 might be performed concurrently (e.g., simultaneously) for multiple levels of adjacency. For example, the method of FIG. 10 might be performed concurrently with the first conductor corresponding to a word line $202_x$ and the second conductor corresponding to an immediately adjacent word line $202_{x-1}$ or $202_{x+1}$, and with the first conductor corresponding to the word line $202_x$ and the second conductor corresponding to a secondary adjacent word line $202_{x-2}$ or $202_{x+2}$, respectively. Similarly, the method of FIG. 10 might be performed concurrently with the first conductor corresponding to a word line $202_x$ and the second conductor corresponding to an immediately adjacent word line $202_{x-1}$, and with the first conductor corresponding to the word line 202$_x$ and the second conductor corresponding to an immediately adjacent word line 202$_{x+1}$.

For some embodiments, the method of FIG. 10 might be performed with the third voltage level being applied to the first conductor and the fourth voltage level being applied to the second conductor at 1053, where the second conductor is one immediately adjacent conductor, and the third voltage level being applied to a third conductor that is a different immediately adjacent conductor. That is, two (or more) adjacent conductors might receive the overdrive voltage difference V$_{od}$.

Figure 11:
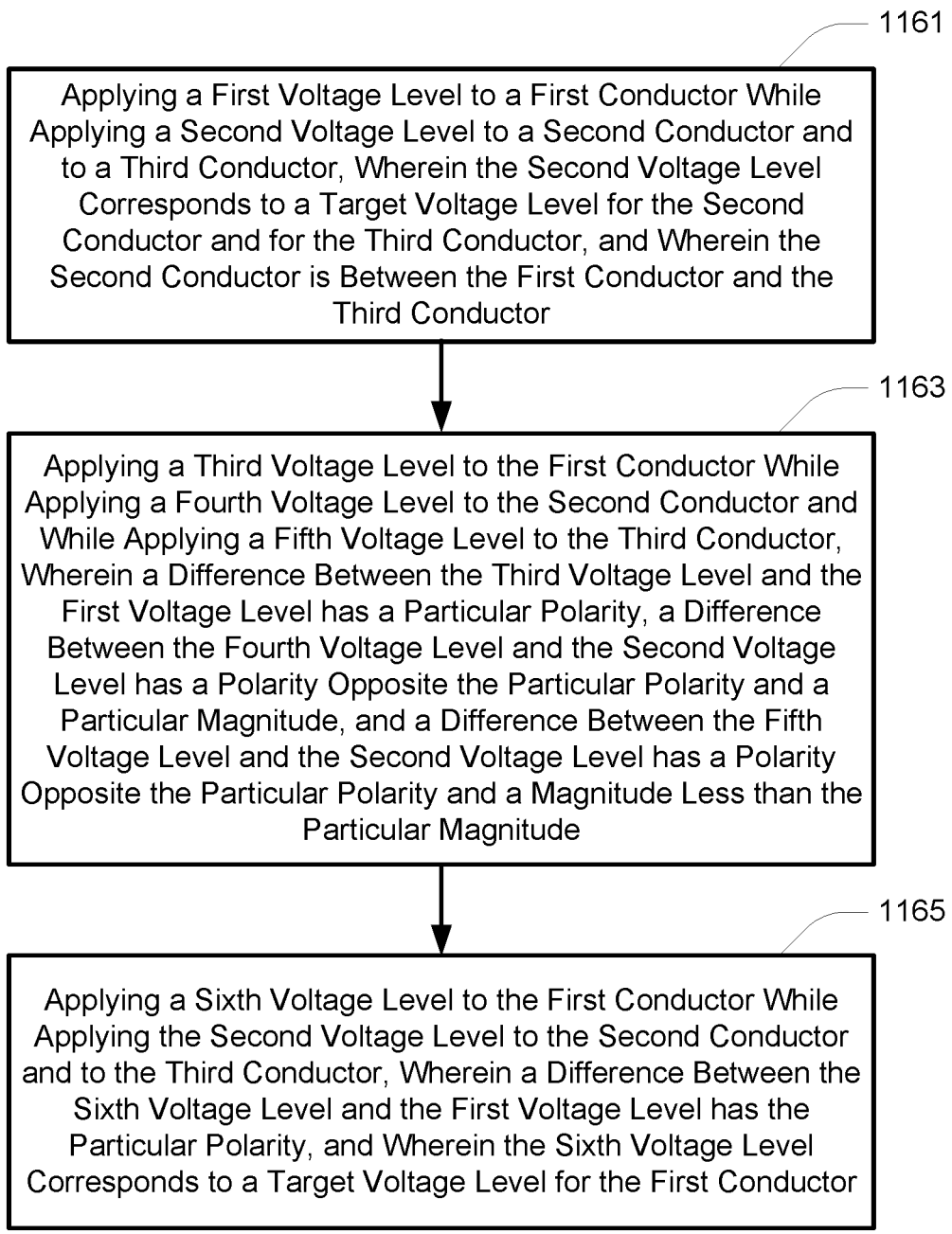
FIG. 11 is a flowchart of a method of driving conductors in accordance with another embodiment.

FIG. 11 is a flowchart of a method of driving conductors in accordance with another embodiment. At 1161, a first voltage level might be applied to a first conductor while applying a second voltage level to a second conductor and to a third conductor. The second voltage level might correspond to a target voltage level for the second conductor and for the third conductor. The second conductor might be between the first conductor and the third conductor. At 1163, e.g., subsequent to 1161, a third voltage level might be applied to the first conductor while applying a fourth voltage level to the second conductor, and while applying a fifth voltage level to the third conductor. A difference between the third voltage level and the first voltage level might have a particular polarity, a difference between the fourth voltage level and the second voltage level might have a polarity opposite the particular polarity and a particular magnitude, and a difference between the fifth voltage level and the second voltage level might have a polarity opposite the particular polarity and a magnitude less than the particular magnitude. At 1165, e.g., subsequent to 1163, a sixth voltage level might be applied to the first conductor while applying the second voltage level to the second conductor and to the third conductor. A difference between the sixth voltage level and the first voltage level might have the particular polarity. The sixth voltage level might correspond to a target voltage level for the first conductor. The difference between the third voltage level and the first voltage level might have a magnitude greater than the difference between the sixth voltage level and the first voltage level. The method of FIG. 11 might be concurrently performed for other conductors of different levels of adjacency to the first conductor, and for other conductors of same levels of adjacency to the first conductor, similar to that described with reference to FIG. 10.

Figure 12:
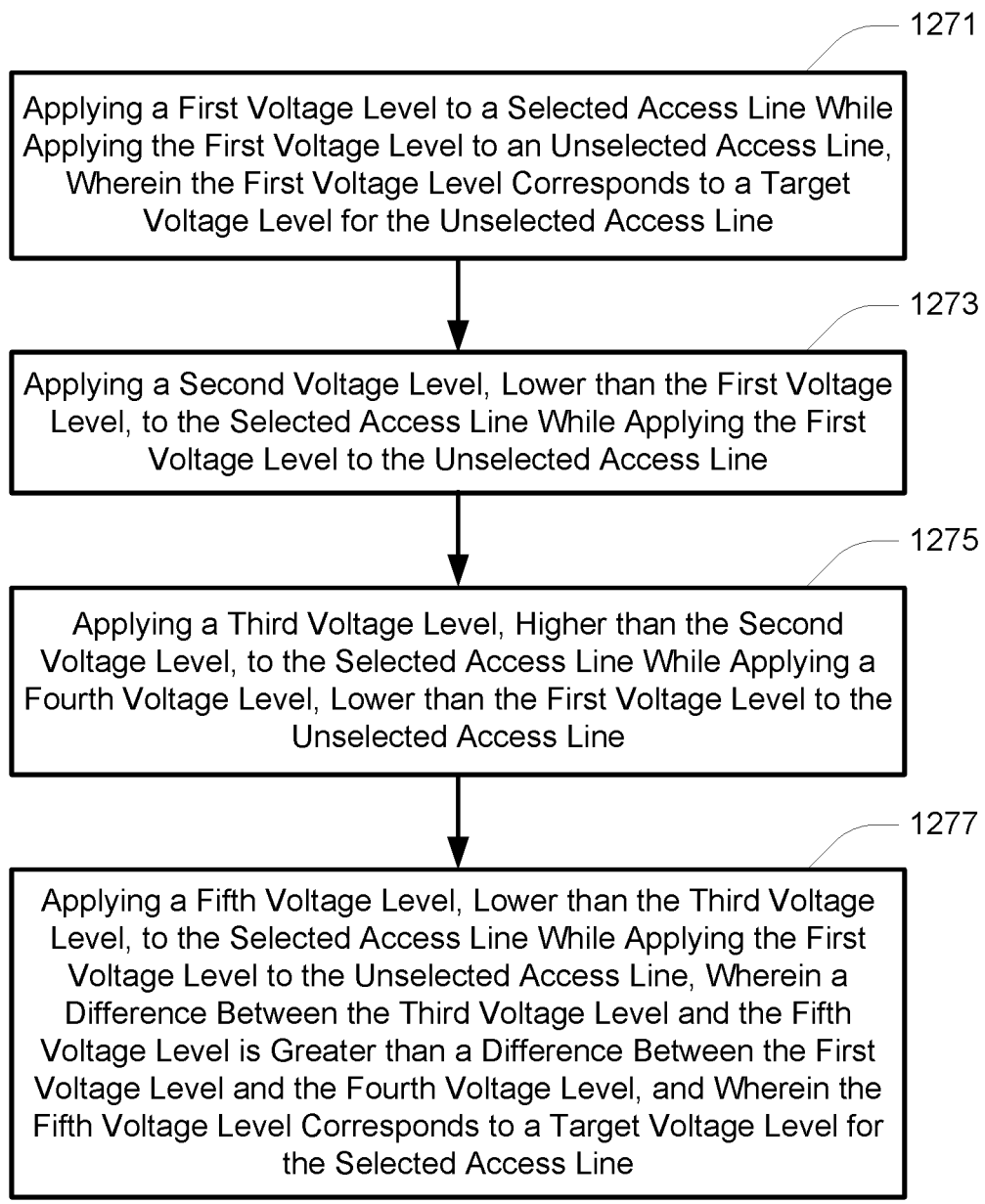
FIG. 12 is a flowchart of a method of operating a memory in accordance with an embodiment.

FIG. 12 is a flowchart of a method of operating a memory in accordance with an embodiment. At 1271, which might correspond to time t0 of FIG. 8A, a first voltage level might be applied to a selected access line while applying the first voltage level to an unselected access line. The first voltage level might correspond to a target voltage level for the unselected access line. At 1273, which might correspond to time t2 of FIG. 8A, a second voltage level, lower than the first voltage level, might be applied to the selected access line while applying the first voltage level to the unselected access line. At 1275, which might correspond to time t3 of FIG. 8A, a third voltage level, higher than the second voltage level, might be applied to the selected access line while applying a fourth voltage level, lower than the first voltage level to the unselected access line. At 1277, which might correspond to time t4 of FIG. 8A, a fifth voltage level, lower than the third voltage level, might be applied to the selected access line while applying the first voltage level to the unselected access line. A difference between the third voltage level and the fifth voltage level might be greater than a difference between the first voltage level and the fourth voltage level. The fifth voltage level might correspond to a target voltage level for the selected access line. The method of FIG. 12 might be concurrently performed for other unselected word lines of different levels of adjacency to the selected word line, and for other unselected word lines of same levels of adjacency to the selected word line, similar to that described with reference to FIG. 10.

Figure 13:
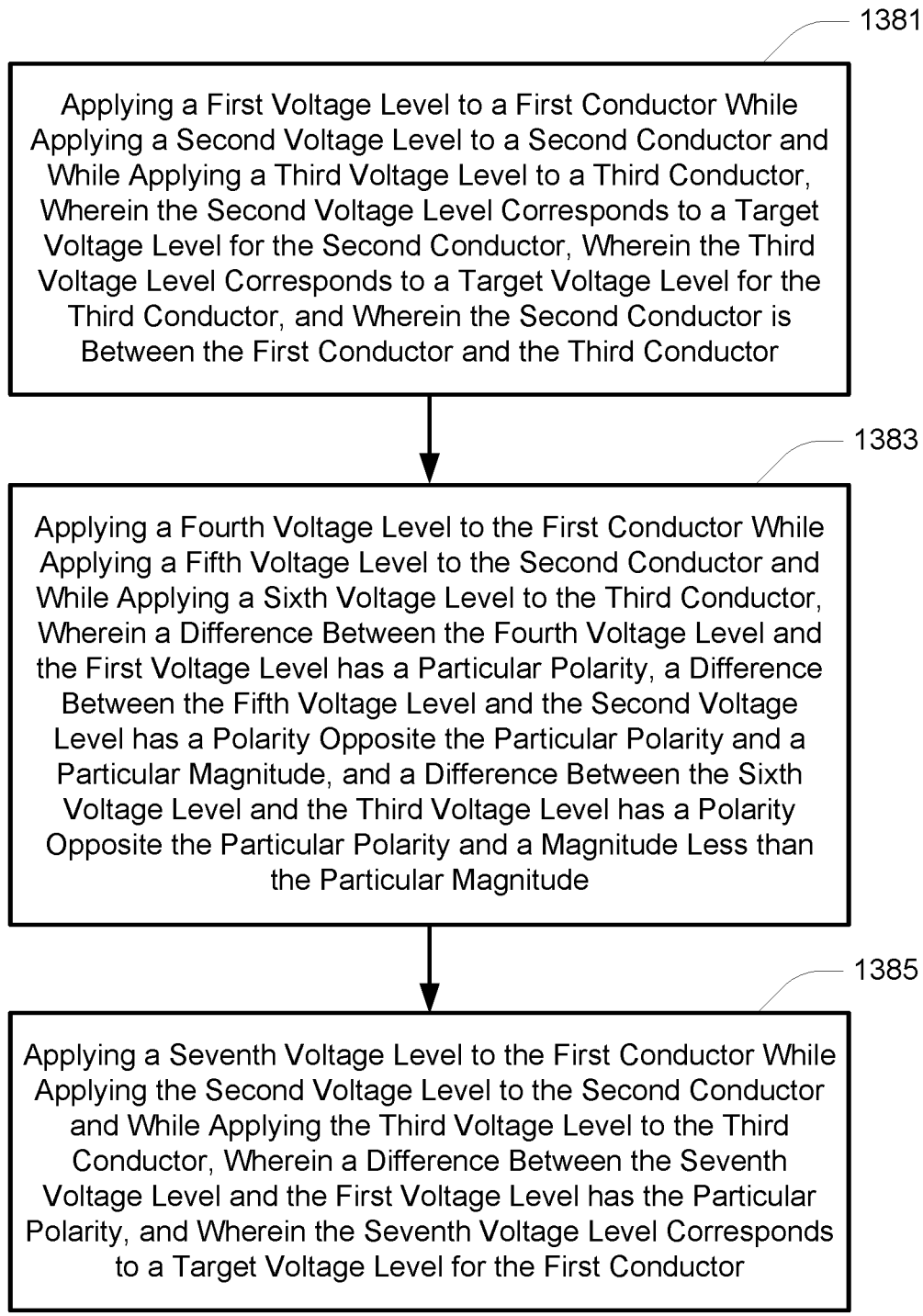
FIG. 13 is a flowchart of a method of driving conductors in accordance with a further embodiment.

FIG. 13 is a flowchart of a method of driving conductors in accordance with another embodiment. At 1381, a first voltage level might be applied to a first conductor while applying a second voltage level to a second conductor and while applying a third voltage level to a third conductor. The second voltage level might correspond to a target voltage level for the second conductor. The third voltage level might correspond to a target voltage level for the third conductor. The third voltage level might be lower than or higher than the second voltage level. The second conductor might be between the first conductor and the third conductor. At 1383, e.g., subsequent to 1381, a fourth voltage level might be applied to the first conductor while applying a fifth voltage level to the second conductor, and while applying a sixth voltage level to the third conductor. A difference between the fourth voltage level and the first voltage level might have a particular polarity, a difference between the fifth voltage level and the second voltage level might have a polarity opposite the particular polarity and a particular magnitude, and a difference between the sixth voltage level and the third voltage level might have a polarity opposite the particular polarity and a magnitude less than the particular magnitude. At 1385, e.g., subsequent to 1383, a seventh voltage level might be applied to the first conductor while applying the second voltage level to the second conductor and while applying the third voltage level to the third conductor. A difference between the seventh voltage level and the first voltage level might have the particular polarity. The seventh voltage level might correspond to a target voltage level for the first conductor. The difference between the fourth voltage level and the first voltage level might have a magnitude greater than the difference between the seventh voltage level and the first voltage level. The method of FIG. 13 might be concurrently performed for other conductors of different levels of adjacency to the first conductor, and for other conductors of same levels of adjacency to the first conductor, similar to that described with reference to FIG. 10.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An integrated circuit device, comprising:
   a first conductor;
   a second conductor; and
   a controller, wherein the controller is configured to cause the integrated circuit device to:
   apply a first voltage level to the first conductor while applying a second voltage level to the second conductor, wherein the second voltage level corresponds to a target voltage level for the second conductor;
   apply a third voltage level to the first conductor while applying a fourth voltage level to the second conductor, wherein a difference between the third voltage level and the first voltage level has a particular polarity, and a difference between the fourth voltage level and the second voltage level has a polarity opposite the particular polarity; and apply a fifth voltage level to the first conductor while applying the second voltage level to the second conductor, wherein a difference between the fifth voltage level and the first voltage level has the particular polarity, and wherein the fifth voltage level corresponds to a target voltage level for the first conductor.

2. The integrated circuit device of claim 1, wherein the second conductor is immediately adjacent the first conductor.

3. The integrated circuit device of claim 2, further comprising:
a third conductor;
wherein the controller is further configured to cause the integrated circuit device to:
apply the second voltage level to the third conductor while applying the first voltage level to the first conductor and while applying the second voltage level to the second conductor, wherein the second voltage level further corresponds to a target voltage level for the third conductor;
apply the fourth voltage level to the third conductor while applying the third voltage level to the first conductor and while applying the fourth voltage level to the second conductor; and
apply the second voltage level to the third conductor while applying the fifth voltage level to the first conductor and while applying the second voltage level to the second conductor;
wherein the first conductor is between the second conductor and the third conductor.

4. The integrated circuit device of claim 2, further comprising:
a third conductor;
wherein the controller is further configured to cause the integrated circuit device to:
apply the second voltage level to the third conductor while applying the first voltage level to the first conductor and while applying the second voltage level to the second conductor, wherein the second voltage level further corresponds to a target voltage level for the third conductor;
apply a sixth voltage level to the third conductor while applying the third voltage level to the first conductor and while applying the fourth voltage level to the second conductor, wherein a difference between the sixth voltage level and the second voltage level has a polarity opposite the particular polarity; and
apply the second voltage level to the third conductor while applying the fifth voltage level to the first conductor and while applying the second voltage level to the second conductor;
wherein the second conductor is between the first conductor and the third conductor; and
wherein a difference between the sixth voltage level and the second voltage level has a magnitude less than a magnitude of the difference between the fourth voltage level and the second voltage level.

5. The integrated circuit device of claim 2, further comprising:
a third conductor;
wherein the controller is further configured to cause the integrated circuit device to:
apply a sixth voltage level to the third conductor while applying the first voltage level to the first conductor and while applying the second voltage level to the second conductor, wherein the sixth voltage level corresponds to a target voltage level for the third conductor;
apply a seventh voltage level to the third conductor while applying the third voltage level to the first conductor and while applying the fourth voltage level to the second conductor, wherein a difference between the seventh voltage level and the sixth voltage level has a polarity opposite the particular polarity; and
apply the sixth voltage level to the third conductor while applying the fifth voltage level to the first conductor and while applying the second voltage level to the second conductor;
wherein the second conductor is between the first conductor and the third conductor; and
wherein a difference between the seventh voltage level and the sixth voltage level has a magnitude less than a magnitude of the difference between the fourth voltage level and the second voltage level.

6. The integrated circuit device of claim 2, further comprising:
a third conductor;
wherein the controller is further configured to cause the integrated circuit device to:
apply the first voltage level to the third conductor while applying the first voltage level to the first conductor and while applying the second voltage level to the second conductor;
apply the third voltage level to the third conductor while applying the third voltage level to the first conductor and while applying the fourth voltage level to the second conductor; and
apply the fifth voltage level to the third conductor while applying the fifth voltage level to the first conductor and while applying the second voltage level to the second conductor;
wherein the first conductor is immediately adjacent the second conductor and immediately adjacent the third conductor.

7. The integrated circuit device of claim 6, further comprising:
a fourth conductor;
wherein the controller is further configured to cause the integrated circuit device to:
apply the second voltage level to the fourth conductor while applying the first voltage level to the first conductor and to the third conductor and while applying the second voltage level to the second conductor, wherein the second voltage level further corresponds to a target voltage level for the fourth conductor;
apply the fourth voltage level to the fourth conductor while applying the third voltage level to the first conductor and to the third conductor and while applying the fourth voltage level to the second conductor; and
apply the second voltage level to the fourth conductor while applying the fifth voltage level to the first conductor and to the third conductor and while applying the second voltage level to the second conductor;

wherein the first conductor is between the third conductor and the second conductor; and
wherein the third conductor is between the fourth conductor and the first conductor.

8. The integrated circuit device of claim 1, wherein the controller being configured to cause the integrated circuit device to apply the first voltage level to the first conductor while applying the second voltage level to the second conductor comprises the controller being configured to cause the integrated circuit device to apply the first voltage level to a first conductive plate while applying the second voltage level to a second conductive plate.

9. The integrated circuit device of claim 1, wherein the second conductive plate is parallel to and immediately adjacent to the first conductive plate.

10. An integrated circuit device, comprising:
a first conductor;
a second conductor;
a third conductor; and
a controller, wherein the controller is configured to cause the integrated circuit device to:
apply a first voltage level to the first conductor while applying a second voltage level to the second conductor and to the third conductor, wherein the second voltage level corresponds to a target voltage level for the second conductor and for the third conductor, and wherein the second conductor is between the first conductor and the third conductor;
apply a third voltage level to the first conductor while applying a fourth voltage level to the second conductor and while applying a fifth voltage level to the third conductor, wherein a difference between the third voltage level and the first voltage level has a particular polarity, a difference between the fourth voltage level and the second voltage level has a polarity opposite the particular polarity and a particular magnitude, and a difference between the fifth voltage level and the second voltage level has the polarity opposite the particular polarity and a magnitude less than the particular magnitude; and
apply a sixth voltage level to the first conductor while applying the second voltage level to the second conductor and to the third conductor, wherein a difference between the sixth voltage level and the first voltage level has the particular polarity, and wherein the sixth voltage level corresponds to a target voltage level for the first conductor.

11. The integrated circuit device of claim 10, further comprising:
a fourth conductor;
wherein the controller is further configured to cause the integrated circuit device to:
apply the fourth voltage level to the fourth conductor while applying the third voltage level to the first conductor, while applying the fourth voltage level to the second conductor, and while applying the fifth voltage level to the third conductor;
wherein the fourth conductor has a same level of adjacency to the first conductor as the second conductor.

12. The integrated circuit device of claim 11, further comprising:
a fifth conductor;
wherein the controller is further configured to cause the integrated circuit device to:
apply the fifth voltage level to the fifth conductor while applying the third voltage level to the first conductor, while applying the fourth voltage level to the second conductor and the fourth conductor, and while applying the fifth voltage level to the third conductor;
wherein the fifth conductor has a same level of adjacency to the first conductor as the third conductor.

13. The integrated circuit device of claim 10, wherein a difference between the second voltage level and the fourth voltage level is equal to X times a difference between the third voltage level and the sixth voltage level with $0<X<1$, wherein a difference between the second voltage level and the fifth voltage level is equal to a particular factor times the difference between the third voltage level and the sixth voltage level, and wherein the particular factor is less than X.

14. The integrated circuit device of claim 13, wherein the particular factor is selected from a group consisting of $X^2$ and $X/2$.

15. The integrated circuit device of claim 10, further comprising:
a fourth conductor;
wherein the controller is further configured to cause the integrated circuit device to:
apply the second voltage level to the fourth conductor while applying the first voltage level to the first conductor and while applying the second voltage level to the second conductor and to the third conductor, wherein the second voltage level corresponds to a target voltage level for the fourth conductor, and wherein the first conductor is between the fourth conductor and the second conductor;
apply the fourth voltage level to the fourth conductor while applying the third voltage level to the first conductor, while applying the fourth voltage level to the second conductor, and while applying the fifth voltage level to the third conductor; and
apply the second voltage level to the fourth conductor while applying the sixth voltage level to the first conductor, and while applying the second voltage level to the second conductor and to the third conductor.

16. The integrated circuit device of claim 15, further comprising:
a fifth conductor;
wherein the controller is further configured to cause the integrated circuit device to:
apply the second voltage level to the fifth conductor while applying the first voltage level to the first conductor and while applying the second voltage level to the second conductor, to the third conductor and to the fourth conductor, wherein the second voltage level corresponds to a target voltage level for the fifth conductor, and wherein the fourth conductor is between the fifth conductor and the first conductor;
apply the fifth voltage level to the fifth conductor while applying the third voltage level to the first conductor, while applying the fourth voltage level to the second conductor and to the fourth conductor, and while applying the fifth voltage level to the third conductor; and
apply the second voltage level to the fifth conductor while applying the sixth voltage level to the first conductor, and while applying the second voltage level to the second conductor, to the third conductor and to the fourth conductor.

17. An integrated circuit device, comprising:
a first conductor;
a second conductor;
a third conductor; and a controller, wherein the controller is configured to cause the integrated circuit device to:
  apply a first voltage level to the first conductor while applying a second voltage level to the second conductor and while applying a third voltage level to the third conductor, wherein the second voltage level corresponds to a target voltage level for the second conductor, wherein the third voltage level corresponds to a target voltage level for the third conductor, and wherein the second conductor is between the first conductor and the third conductor;
  apply a fourth voltage level to the first conductor while applying a fifth voltage level to the second conductor and while applying a sixth voltage level to the third conductor, wherein a difference between the fourth voltage level and the first voltage level has a particular polarity, a difference between the fifth voltage level and the second voltage level has a polarity opposite the particular polarity and a particular magnitude, and a difference between the sixth voltage level and the third voltage level has a polarity opposite the particular polarity and a magnitude less than the particular magnitude; and
  apply a seventh voltage level to the first conductor while applying the second voltage level to the second conductor and while applying the third voltage level to the third conductor, wherein a difference between the seventh voltage level and the first voltage level has the particular polarity, and wherein the seventh voltage level corresponds to a target voltage level for the first conductor.

18. The integrated circuit device of claim 17, wherein the second conductor is immediately adjacent the first conductor in a first direction, and the third conductor is immediately adjacent the second conductor in the first direction.

19. The integrated circuit device of claim 17, wherein a difference between the second voltage level and the fifth voltage level is equal to X times a difference between the third voltage level and the seventh voltage level with 0<X<1, wherein a difference between the third voltage level and the sixth voltage level is equal to a particular factor times the difference between the third voltage level and the seventh voltage level, and wherein the particular factor is less than X.

20. The integrated circuit device of claim 17, wherein the second voltage level is higher than the third voltage level.

21. The integrated circuit device of claim 17, further comprising:
  a fourth conductor;
  wherein the controller is further configured to cause the integrated circuit device to:
    apply an eighth voltage level to the fourth conductor while applying the first voltage level to the first conductor, while applying the second voltage level to the second conductor and while applying the third voltage level to the third conductor, wherein the eighth voltage level corresponds to a target voltage level for the fourth conductor, and wherein the third conductor is between the second conductor and the fourth conductor;
    apply a ninth voltage level to the fourth conductor while applying the fourth voltage level to the first conductor, while applying the fifth voltage level to the second conductor and while applying the sixth voltage level to the third conductor, wherein a difference between the ninth voltage level and the eighth voltage level has the polarity opposite the particular polarity and a magnitude less than the difference between the sixth voltage level and the third voltage level; and
    apply the eighth voltage level to the fourth conductor while applying the seventh voltage level to the first conductor, while applying the second voltage level to the second conductor and while applying the third voltage level to the third conductor.

22. The integrated circuit device of claim 17, wherein the second conductor is immediately adjacent the first conductor in a first direction, the third conductor is immediately adjacent the second conductor in the first direction, and the fourth conductor is immediately adjacent the third conductor in the first direction.

* * * * *